(12) United States Patent
Imasu et al.

(10) Patent No.: US 6,492,737 B1
(45) Date of Patent: Dec. 10, 2002

(54) ELECTRONIC DEVICE AND A METHOD OF MANUFACTURING THE SAME

(75) Inventors: Satoshi Imasu, Hitachinaka (JP); Ikuo Yoshida, Musashimurayama (JP); Norio Kishikawa, Ome (JP); Yoshiyuki Kado, Ome (JP); Kazuyuki Taguchi, Hamura (JP); Takahiro Naito, Kodaira (JP); Toshihiko Sato, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/921,919

(22) Filed: Aug. 6, 2001

(30) Foreign Application Priority Data

Aug. 31, 2000 (JP) .......................... 2000-262511

(51) Int. Cl.[7] .......................... H01L 23/12; H01L 23/50
(52) U.S. Cl. ...................... 257/778; 257/723; 257/737; 361/773; 361/783; 438/108; 438/119; 438/614
(58) Field of Search ................. 361/760, 772, 361/773, 774, 783; 257/723, 737, 738, 778; 438/108, 119, 125, 613, 614, 617; 29/840; 228/180.22

(56) References Cited

U.S. PATENT DOCUMENTS

| 5,075,965 A | * 12/1991 | Carey et al. ................... 29/840 |
| 5,298,460 A | * 3/1994 | Nishiguchi et al. ..... 228/180.22 |
| 5,598,036 A | * 1/1997 | Ho .............................. 257/738 |
| 5,615,827 A | * 4/1997 | Arldt et al. .................... 29/840 |
| 5,742,100 A | * 4/1998 | Schroeder et al. ........... 257/778 |
| 5,768,109 A | * 6/1998 | Gulick et al. ................ 361/783 |
| 5,874,780 A | * 2/1999 | Murakami .................... 257/737 |
| 6,125,043 A | * 9/2000 | Hauer et al. ................. 361/760 |
| 6,191,493 B1 | * 2/2001 | Yasunaga et al. ............ 257/778 |
| 6,204,563 B1 | * 3/2001 | Ohuchi et al. ............... 257/778 |
| 6,208,525 B1 | 3/2001 | Imasu et al. ................. 361/783 |
| 6,214,716 B1 | * 4/2001 | Akram ......................... 438/613 |
| 6,281,581 B1 | * 8/2001 | Desai et al. ................. 257/737 |
| 6,310,780 B1 | * 10/2001 | Tamura et al. .............. 361/760 |
| 6,324,067 B1 | * 11/2001 | Nishiyama ................... 361/783 |
| 6,358,762 B1 | * 3/2002 | Kohno et al. ............... 438/612 |
| 2002/0050652 A1 | * 5/2002 | Akram et al. ............... 438/108 |

FOREIGN PATENT DOCUMENTS

JP         10-270496         10/1998

* cited by examiner

Primary Examiner—Kamand Cuneo
Assistant Examiner—John B. Vigushin
(74) Attorney, Agent, or Firm—Miles & Stockbridge P.C.

(57) ABSTRACT

An electronic device comprising: a semiconductor chip having plural electrode pads on one main surface thereof; a wiring board having plural connection parts; and plural salient electrodes disposed respectively between the electrode pads of the semiconductor chip and the connection parts of the wiring board to provide electrical connections between the two, the salient electrodes being arranged in an array not providing balance of the semiconductor chip with respect to one main surface of the wiring board, the plural connection parts of the wiring board being arranged at a deeper position than one main surface of the wiring board in a depth direction from the one main surface.

10 Claims, 18 Drawing Sheets

ELECTRONIC DEVICE AND A METHOD OF MANUFACTURING THE SAME

FIELD OF THE INVENTION

The present invention relates to an electronic device and a method of manufacturing the same. Particularly, the invention is concerned with a technique applicable effectively to an electronic device which adopts a flip-chip mounting technique.

BACKGROUND OF THE INVENTION

As an electronic device there is known an electronic device called MCM (Multi Chip Module). In MCM, plural semiconductor chips each incorporating an integrated circuit are mounted on a wiring board to implement one synthetic function. In connection with MCM, the adoption of a flip-chip mounting technique is becoming more and more popular in which a semiconductor chip (flip-chip) with salient electrodes formed on electrode pads on a circuit-formed surface is mounted onto a wiring board. This is for increasing the data transfer speed and for the reduction of size.

As to the flip-chip mounting technique, various mounting methods have been proposed and put to practical use. For example, mounting methods called CCB (Controlled Collapse Bonding) and ACF (Anisotropic Conductive Film) mounting are adopted practically.

In CCB method, solder bumps of, for example, a ball shape are formed as bump electrodes (salient electrodes) on electrode pads of a semiconductor chip, then the semiconductor chip is put on a wiring board, and thereafter a heat treatment for melting the solder bumps is performed to connect connection parts as wiring portions on the wiring board with the electrode pads of the semiconductor chip electrically and mechanically.

In ACF mounting method, stud bumps of such as gold (Au) are formed as bump electrodes (salient electrodes) on electrode pads of a semiconductor chip, then the semiconductor chip is put on a wiring board through an anisotropic conductive resin (ACF) of a sheet shape as a bonding resin, thereafter the semiconductor chip is compression-bonded to the wiring board under heating and the stud bumps are electrically connected to connection parts on the wiring board. The anisotropic conductive resin comprises an insulating resin and a large number of conductive particles dispersed and mixed therein.

SUMMARY OF THE INVENTION

Having studied the foregoing flip-chip mounting techniques, the present inventors found out the following problems.
(1) There are various types of arrays as pad arrays of a semiconductor chip. Among them is included a central pad array in which plural electrode pads are arranged in a line along a central region which extends along a center line in X or Y direction of a circuit-formed surface of a semiconductor chip. This central pad array is adopted, for example, for a semiconductor chip in which is incorporated a DRAM (Dynamic Random Access Memory) as a memory circuit.

For example in the case of a DRAM there are the following requirements with respect to the arrangement of electrode pads (bonding pads). Electrode pads should be arranged near an input/output circuit for the reduction of wiring inductance. Moreover, for the prevention of device damage in bonding process, a semiconductor device should not be formed just under electrode pads. Further, for the purpose of improving the operating speed, the distance from an input/output circuit up to a remotest portion in a memory mat should be made as short as possible. Satisfying these requirements results in such a layout on DRAM chip as shown in FIG. 21, in which electrode pads are arranged centrally in a long side direction of the chip. In FIG. 21, the numeral 30 denotes a DRAM chip, MARY denotes a memory array, PC denotes a peripheral circuit, I/O denotes an input/output circuit, and BP denotes an electrode pad.

In the case of a central pad array, the array of bump electrodes formed respectively on the electrodes pads is also a central bump array. If such a semiconductor chip is used in flip chip mounting, it is impossible to take balance of the chip, so that the chip tilts with respect to one main surface of a wiring board. Thus, in the case of a semiconductor chip having a central pad array, it is difficult to effect flip chip mounting. As another example of a pad array (bump array) with a semiconductor chip not well-balanced, there is, other than the central pad array, a one-side pad array (one-side bump array) in which plural electrodes pads are arranged in a line along one of two opposed sides of the chip.

(2) In ACF mounting method, stud bumps are compression-bonded to connection parts on a wiring board with a thermoshrinking force (a shrinking force developed upon return to a state of normal temperature from a heated state) or a thermocuring shrinking force (a shrinking force developed upon curing of a thermosetting resin) of an anisotropic conductive resin interposed between a wiring board and a semiconductor chip. On the other hand, since the thermal expansion coefficient of an anisotropic conductive resin is generally larger than that of stud bumps, the amount of expansion in the thickness direction of the anisotropic conductive resin is larger than that in the height direction of stud bumps. Consequently, there may occur a poor connection such that stud bumps come off from connection parts on the wiring board due to the influence of heat. Therefore, it is necessary that the volume of the anisotropic conductive resin between the wiring board and the semiconductor chip be made as small as possible.

In this connection, a technique for diminishing the volume of an anisotropic conductive resin between a wiring board and a semiconductor chip is disclosed, for example, in Japanese Published Unexamined Patent Application No. Hei 10(1998)-270496 (U.S. Pat. No. 6,208,525). According to the technique disclosed in this unexamined publication, as shown in FIG. 12 thereof, "a groove 19A is formed in a rigid wiring board 19, electrode pads 4A formed within the groove 19A, and the electrode pads 4A and bump electrodes 15 are connected together within the groove 19. According to this configuration, a gap between the wiring board 19 and a semiconductor chip 10 becomes narrower by an amount corresponding to the depth of the groove 19A in comparison with the case where there is no top insulating layer on the wiring board and the electrodes pads 4A and a top wiring layer are exposed, whereby it is possible to reduce the thickness of an adhesive (anisotropic conductive resin) 16 interposed between the wiring board 19 and the semiconductor chip 10."

However, according to the above configuration wherein a groove is formed in a wiring board and electrode pads (connection parts) on the wiring board and bump electrodes (stud bumps) are connected together within the groove, there arises a new problem.

In the case of electrode pads on a semiconductor chip, a plane size depends on the array pitch of the electrode pads (a pad array pitch) and the narrower the pad array pitch, the smaller the plane size. If a thinner gold wire is used to form stud bumps of a smaller diameter with such a decrease in size of the electrode pads, the height of each stud bump also becomes smaller accordingly. That is, if the pad array pitch differs, the stud bump height differs as well.

On the other hand, in a certain electronic device, such as MCM, several types of semiconductor chips different in the degree of integration and in function are mounted on a single wiring board, but these semiconductor chips are not always equal in pad array pitch. With different pad array pitches, there are different stud bump heights, so in the case of a semiconductor chip wherein the stud bump height is larger than the depth from one main surface of a wiring board to connection parts thereof, it is possible to easily effect connection between the wiring board connection parts and the stud bumps, but in the case of a semiconductor chip wherein the stud bump height is smaller than the depth from one main surface of a wiring board to connection parts thereof, it is difficult to effect connection between the wiring board connection parts and the stud bumps.

If a depth position of the wiring board connection parts is set to match the semiconductor chip having the smallest stud bump height out of the semiconductor chips to be mounted on the wiring board, stud bumps can be connected to the wiring board connection parts even in a semiconductor chip having the smallest stud bump height. In this case, however, in a semiconductor chip having a large stud bump height, the volume of an anisotropic conductive resin interposed between the semiconductor chip and the wiring board becomes large and there may occur a poor connection such that the stud bumps come off from the wiring board connection parts under the influence of heat.

It is an object of the present invention to provide a technique capable of suppressing a tilt of a semiconductor chip relative to one main surface of a wiring board.

It is another object of the present invention to provide a technique which permits several types of semiconductor chips different in pad array pitch to be mounted on a single wiring board.

The above and other objects and novel features of the present invention will become apparent from the following description and the accompanying drawings.

A brief description will be given below about typical inventions out of those disclosed herein.

(1) An electronic device according to the present invention includes:
   a semiconductor chip having a plurality of electrode pads on one main surface thereof;
   a wiring board having a plurality of connection parts exposed on a surface thereof; and
   a plurality of salient electrodes arranged in a line between the electrode pads of the semiconductor chip and the connection parts of the wiring board,
   the plural connection parts of the wiring board being located at a deeper position than the one main surface of the wiring board in a depth direction from the one main surface.

The wiring board further includes an insulating film comprising the one main surface and an opening formed in the insulating film, and the plural connection parts are disposed in a bottom of the opening.

The insulating film is present straddling a peripheral edge of the semiconductor chip.

A plane size of the opening is smaller than that of the semiconductor chip, while a plane size of the insulating film is larger than that of the semiconductor chip.

According to the above means (1), the height of the salient electrodes is absorbed by the depth from the one main surface of the wiring board to the connection parts at the time of flip-chip mounting of the semiconductor chip, so that it is possible to suppress a tilt of the semiconductor chip relative to the one main surface of the wiring board.

(2) An electronic device according to the present invention includes:
   a first semiconductor chip having a plurality of first electrode pads arranged at a first pad array pitch on one main surface thereof;
   a second semiconductor chip having a plurality of second electrode pads arranged on one main surface thereof at a second pad array pitch smaller than the first pad array pitch;
   a wiring board having in a first area of one main surface thereof a plurality of first connection parts arranged correspondingly to the plural first electrode pads and also having in a second area different from the first area on the one main surface a plurality of second connection parts arranged correspondingly to the plural second electrode pads;
   a plurality of first salient electrodes each disposed between each of the first electrode pads and each of the first connection parts and providing an electrical connection between the two; and
   a plurality of second salient electrodes each disposed between each of the second electrode pads and each of the second connection parts and providing an electrical connection between the two, the plural first connection parts and the plural second connection parts being disposed at a deeper position than the one main surface of the wiring board in a depth direction from the one main surface, and
   the second plural salient electrodes having a multistage bump structure with a larger number of stages than the plural first salient electrodes.

The wiring board further includes an insulating film formed on the one main surface thereof, a first opening in the insulating film in the first area of the one main surface, and a second opening formed in the insulating film in the second area of the main surface, the plural first connection parts are disposed in a bottom of the first opening and the plural second connection parts are disposed in a bottom of the second opening.

The second salient electrodes have a multi-stage bump structure having base bumps connected to the second electrode pads of the second semiconductor chip and stack bumps stacked on the base bumps.

The second salient electrodes have a multi-stage bump structure having base bumps connected to the second electrode pads of the second semiconductor chips, first stack bumps stacked on the base bumps, and second stack bumps stacked on the first stack bumps.

According to the above means (2), at the time of flip-chip mounting the first and second semiconductor chips, salient electrodes can be connected to the second connection parts of the wiring board also in the second semiconductor chip, so that the first and second semiconductor chips different in pad array pitch can be mounted on a single wiring board.

DESCRIPTION OF THE PREFERRED EMBODIMENTS

Figure 1:
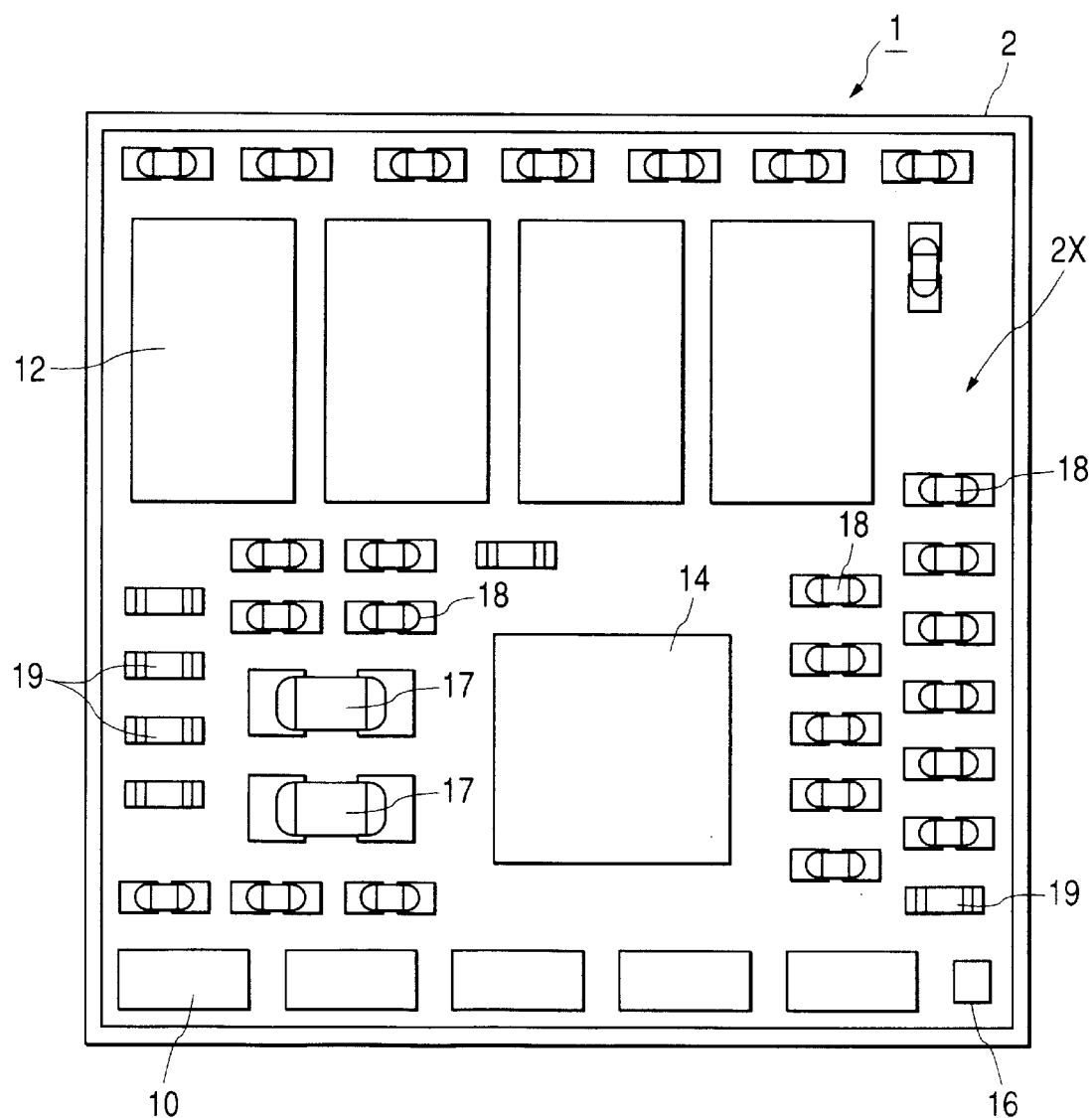
FIG. 1 is a schematic plan view of an MCM (an electronic device) according to the first embodiment of the present invention.

Embodiments of the present invention will be described in detail hereinunder with reference to the drawings. In all of the drawings for illustrating the embodiments, the portions having the same functions are identified by the same reference numerals and repeated explanations thereof will be omitted.

Figure 2:
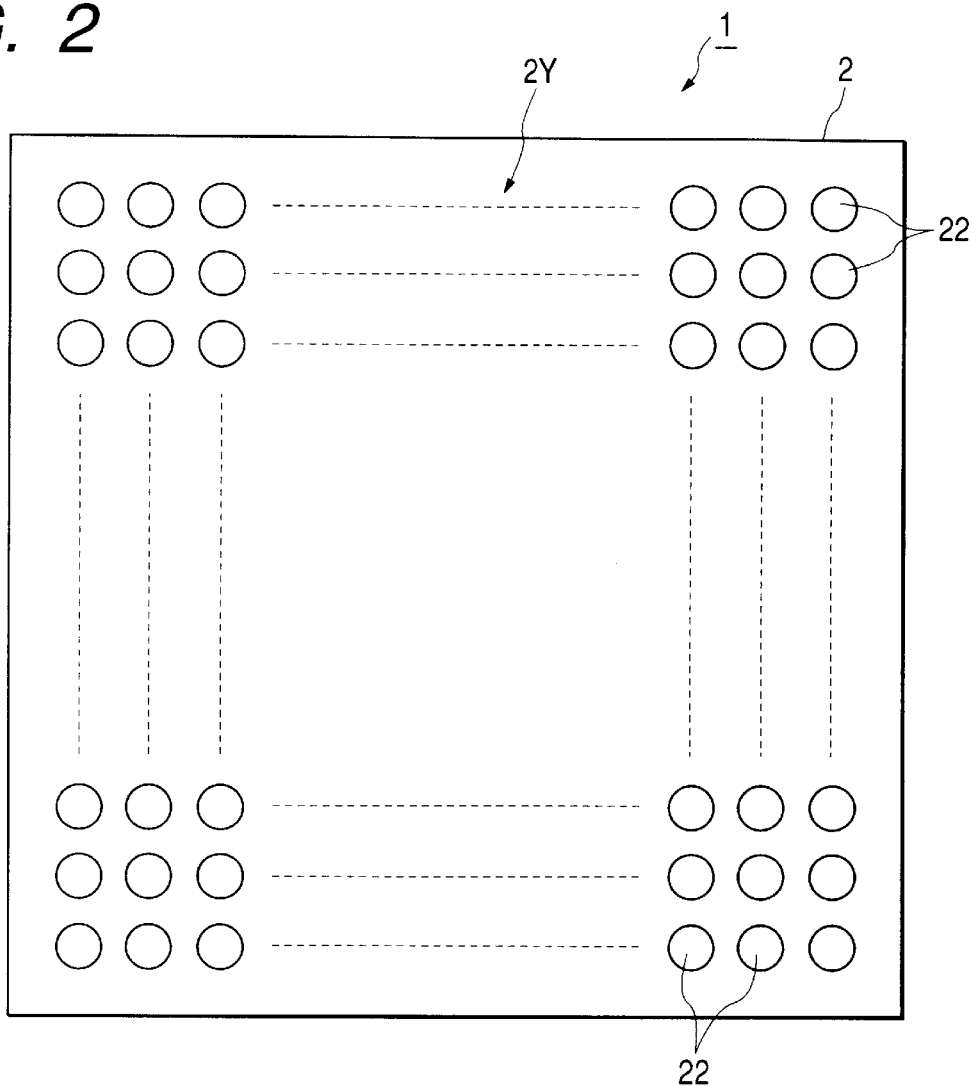
FIG. 2 is a schematic bottom view of the MCM shown in FIG. 1.
Figure 3:
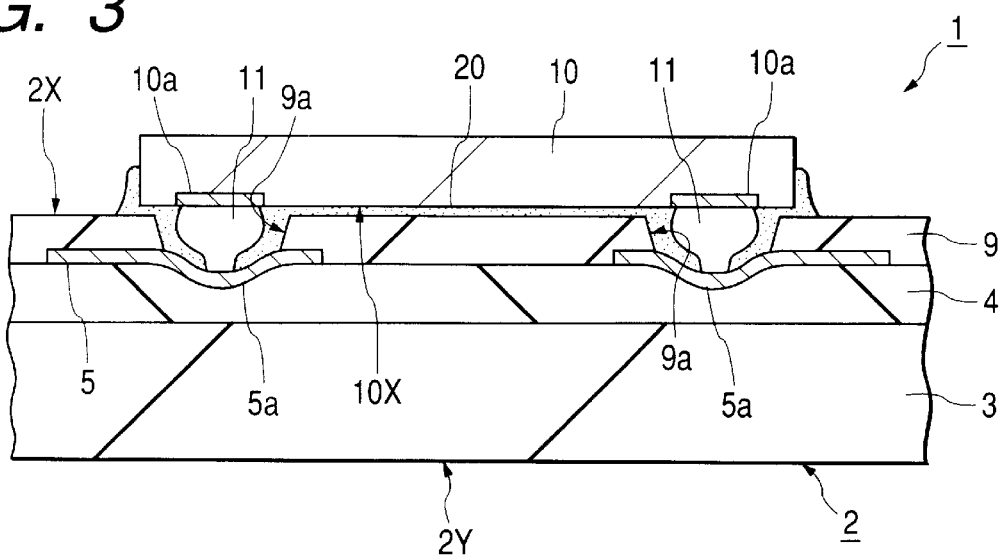
FIG. 3 is a schematic sectional view showing a mounted state of a chip for buffer incorporated in the MCM shown in FIG. 1.
Figure 4:
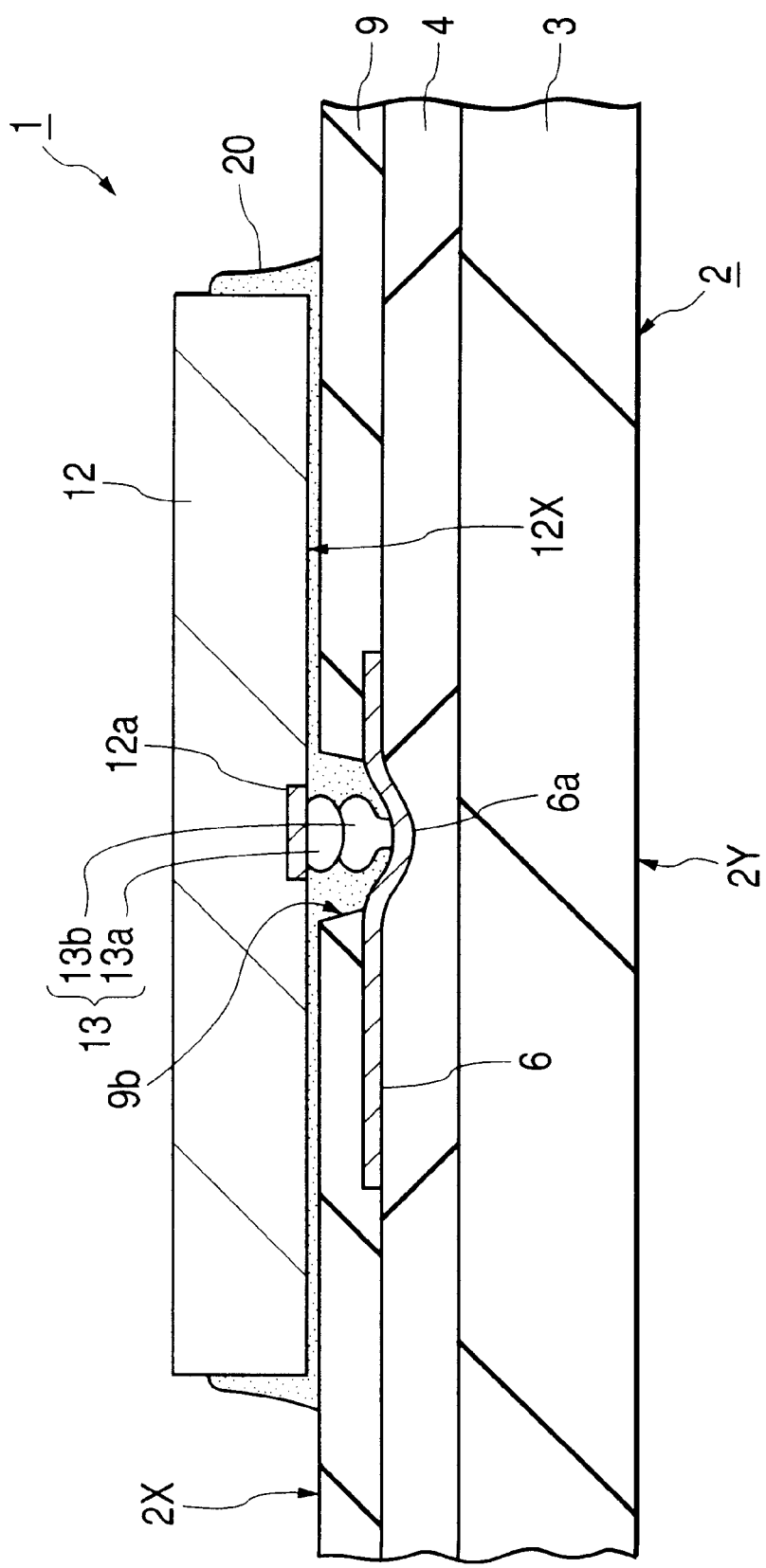
FIG. 4 is a schematic sectional view showing a mounted state of chip for memory incorporated in the MCM shown in FIG. 1.
Figure 5:
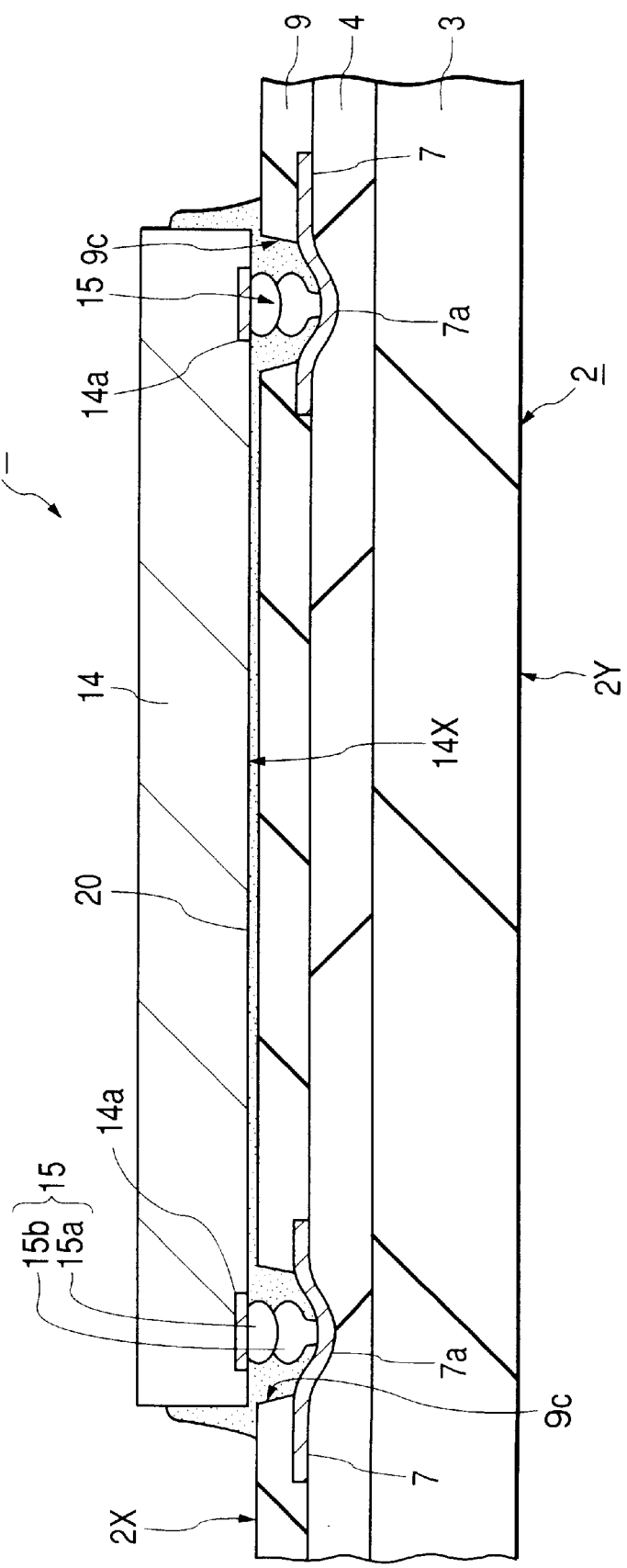
FIG. 5 is a schematic sectional view showing a mounted state of a chip for control incorporated in the MCM shown in FIG. 1.
Figure 6:
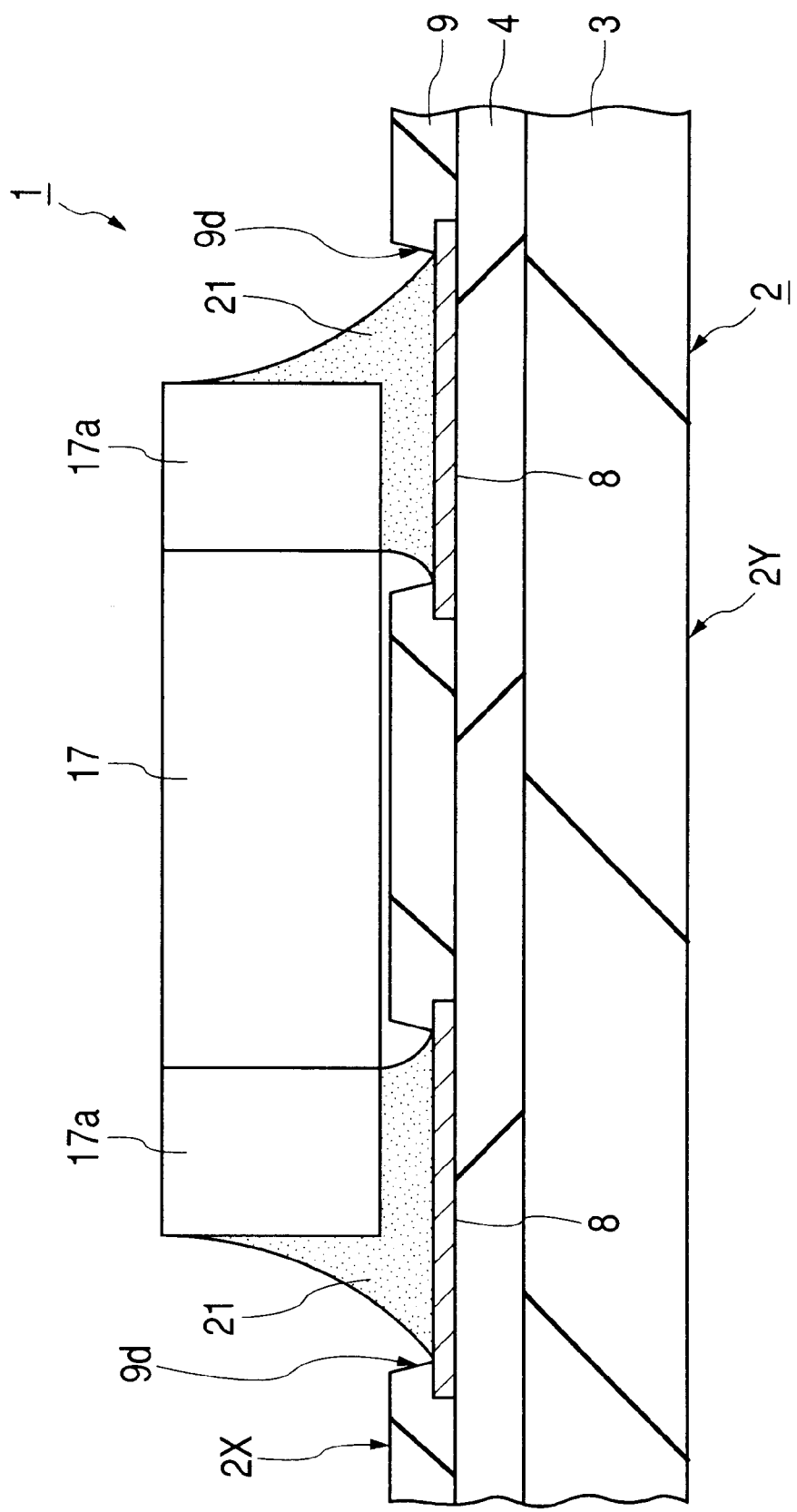
FIG. 6 is a schematic sectional view showing a mounted state of a capacitor incorporated in the MCM shown in FIG. 1.
Figure 7A:
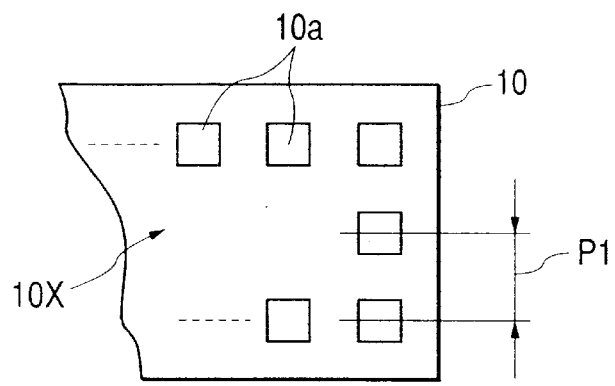
FIGS. 7(a), 7(b) and 7(c) a schematic plan views showing partially pad arrays of the chips for buffer, for memory and for control incorporated in the MCM shown in FIG. 1.
Figure 7B:
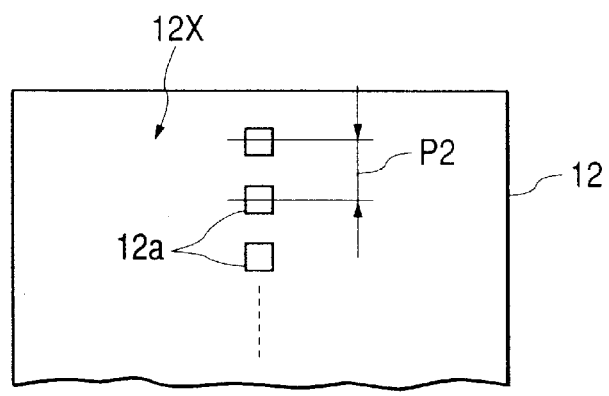
Figure 7C:
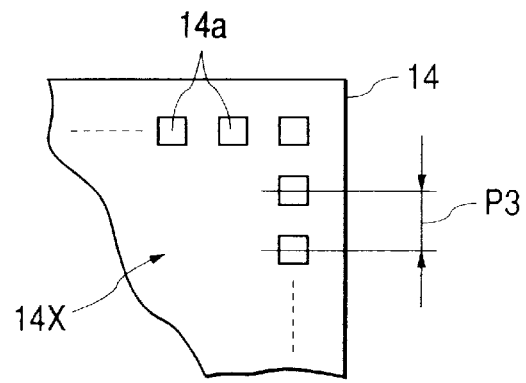
Figure 8A:
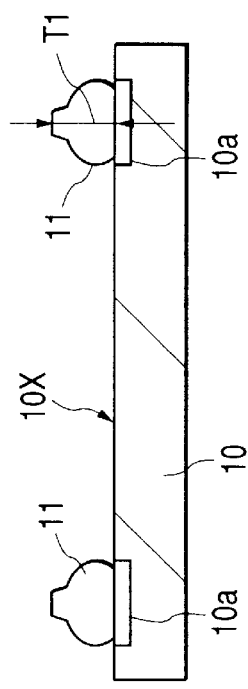
FIGS. 8(a), 8(b) and 8(c) are schematic sectional views showing schematic configurations of the chips for buffer, for memory and for control incorporated in the MCM.
Figure 8B:
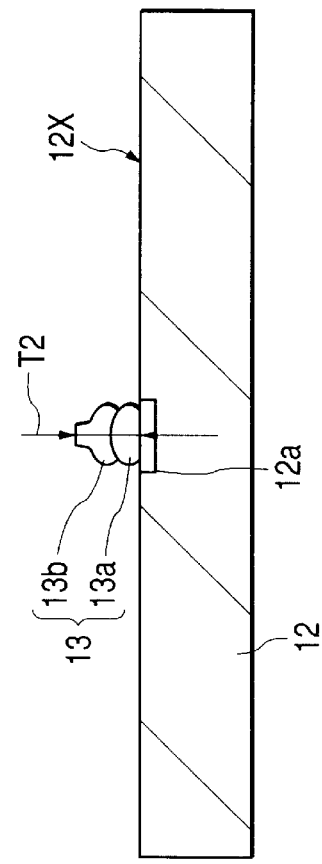
Figure 8C:
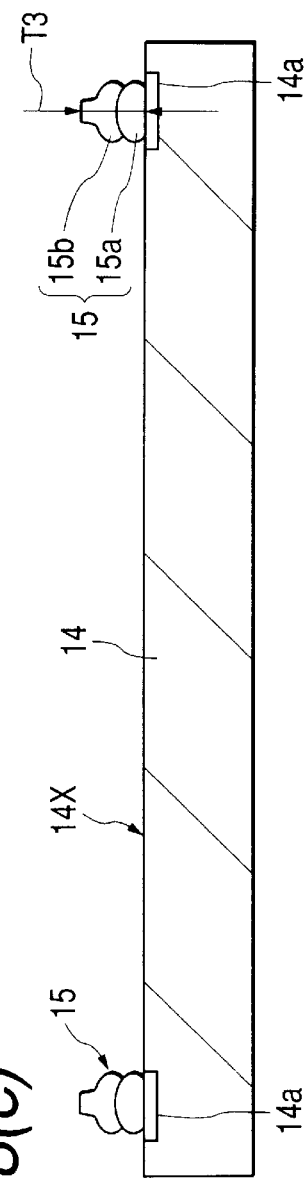
Figure 9:
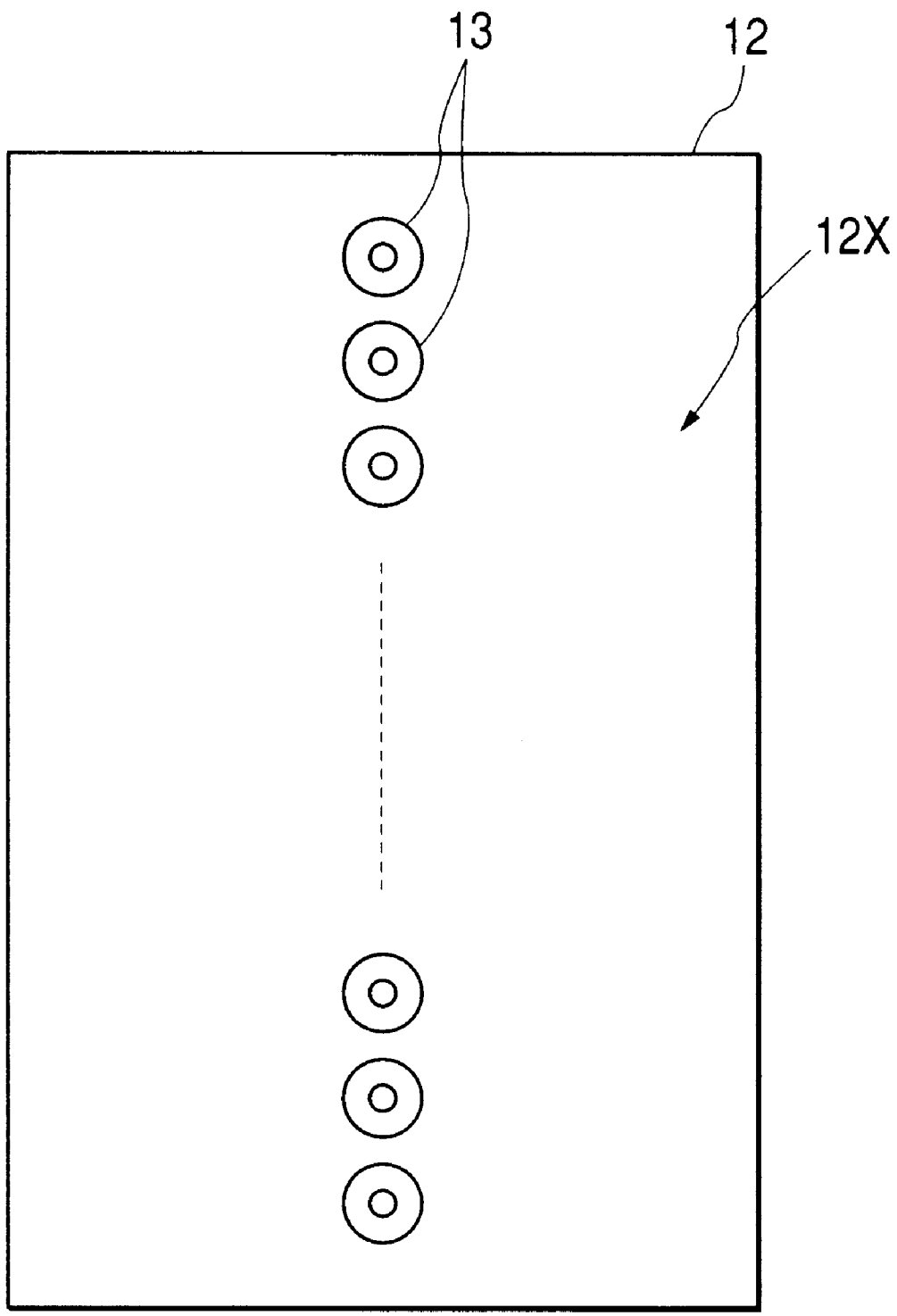
FIG. 9 is a schematic plan view showing a schematic configuration of the chip for memory incorporated in the MCM shown in FIG. 1.
Figure 10:
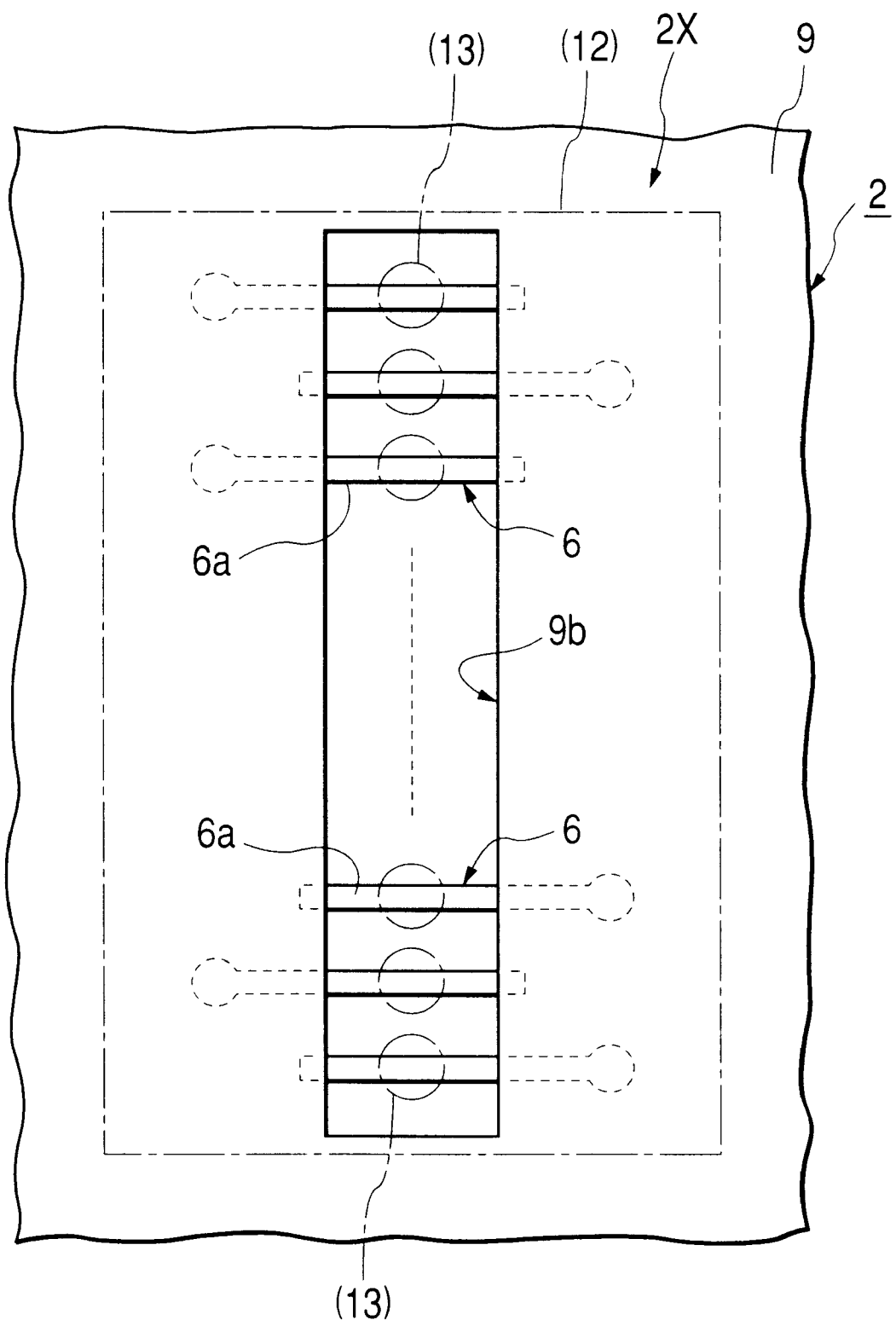
FIG. 10 is a schematic plan view showing a part of a wiring board used in the MCM shown in FIG. 1.

FIG. 1 is a schematic plan view of an MCM (an electronic device) according to the first embodiment of the present invention, FIG. 2 is a schematic bottom view thereof, and FIG. 3 is a schematic sectional view showing a mounted state of a chip for buffer incorporated in the MCM of FIG. 1, FIG. 4 is a schematic sectional view showing a mounted state of a chip for memory incorporated in the MCM of FIG. 1, FIG. 5 is a schematic sectional view showing a mounted state of a chip for control incorporated in the MCM of FIG. 1, FIG. 6 is a schematic sectional view showing a mounted state of a capacitor incorporated in the MCM of FIG. 1, FIGS. 7(a)–7(c) are schematic plan views showing partially pad arrangements of a chip for buffer, a chip for memory and a chip for control incorporated in the MCM of FIG. 1, FIGS. 8(a)–8(c) are schematic sectional views showing schematic configurations of the chips for buffer, for memory and for control incorporated in the MCM of FIG. 1, FIG. 9 is a schematic sectional view of the chip for memory incorporated in the MCM of FIG. 1, and FIG. 10 is a schematic plan view showing a part of a wiring board used in the MCM of FIG. 1.

As shown in FIGS. 1 and 2, according to the configuration of an MCM (electronic device) 1 of this embodiment, plural active components and plural passive components are mounted as electronic components on one main surface 2X of a wiring board 2, while plural ball-like solder bumps 22 are arranged as external connecting terminals on a back side (the other main surface) 2Y opposed to the main surface of the wiring board 2. As active components are used plural semiconductor chips (hereinafter referred to as "buffer chips") 10 each incorporating a buffer circuit, plural semiconductor chips ("memory chips" hereinafter) 12 each incorporating a memory circuit (e.g., SDRAM), one semiconductor chip ("control chip" hereinafter) 14 incorporating a control circuit, and one semiconductor chip ("arithmetic chip" hereinafter) 16 incorporating a NAND circuit. These active components are mounted on one main surface of the wiring board 2 in accordance with a flip chip mounting technique. As passive components are used plural capacitors 17, 18 and resistors 19 both of a surface-mounted type. These passive components are mounted on one main surface of the wiring board 2 in accordance with a solder reflow method.

As shown in FIGS. 3 to 6, the wiring board 2 has a rigid substrate 3, a soft layer 4 formed on the rigid substrate 3 by a build-up method, and an insulating film 9 formed on the soft layer 4. The rigid substrate 3 and the soft layer 4 have a multi-layer interconnection structure though the details thereof are not illustrated. Insulating layers in the rigid substrate 3 are formed by highly elastic resin sheets comprising glass fibers impregnated with an epoxy or polyimide resin, while insulating layers in the soft layer 4 are formed by an epoxy resin of low elasticity for example. Further, wiring layers in the rigid substrate 3 and the soft layer 4 are formed by metallic films such as copper (Cu) films for example. The insulating layer 9 is formed of a polyimide resin for example. The insulating film 9 controls wetting and spreading of solder of soldered components (17, 18 and 19 in this embodiment) during mounting of the components and ensures a bonding force of flip chip components (10, 12 and 14 in this embodiment) for a bonding resin during mounting of the components.

The buffer chips 10, memory chips 12, control chip 14 and arithmetic chip 16 are formed in a square or rectangular shape in plan. In this embodiment, the buffer chips 10 and memory chips 12 are each formed in a rectangular shape, while the control chip 14 and arithmetic chip 16 are each formed in a square shape.

The buffer chips 10, memory chips 12, control chip 14 and arithmetic chip 16 each mainly comprise a semiconductor substrate, a multi-layer interconnection comprising insulating layers and wiring layers stacked in plural stages on a circuit-formed surface of the semiconductor substrate, and a surface protecting layer (final protection) formed so as to cover the multi-layer interconnection. For example, the semiconductor substrate is formed of a single crystal silicon, the insulating layer is formed by a silicon oxide film, and the interconnection is formed by a metallic film such as aluminum (Al) or aluminum alloy film. A surface protecting film of the memory chips 12 is formed using, for example, a polyimide resin capable of improving an anti-α ray strength in memory. Surface protecting films of the buffer chips 10, control chip 14 and arithmetic chip 16 are each formed by an insulating film such as, for example, a silicon oxide or silicon nitride film, or an organic insulating film. As to the arithmetic chip 16, a further explanation thereof will be omitted because it is of substantially the same configuration as the buffer chips 10.

In each of the buffer chips 10, memory chips 12 and control chip 14, plural electrode pads (10a, 12a, 14a) are formed on a circuit-formed surface (10X, 12X, 14X) which is one main surface out of one main surface and the other main surface opposed to each other, as shown in FIGS. 3 and 7. The electrodes pads (10a, 12a, 14a) of each chip are formed on the top wiring layer in the multi-layer interconnection of each chip and are exposed through a bonding opening formed in the surface protecting film of each chip.

As shown in FIG. 7(a), the electrode pads 10a of each buffer chip 10 are arranged along sides of a circuit-formed surface 10X of the buffer chip. As shown in FIG. 7(b), the electrode pads 12a of each memory chip 12 are arranged along a central region which extends along a long-side center line out of two center lines in long (X) and short (Y) directions crossing each other of the circuit-formed surface 12X of the memory chip 12. As shown in FIG. 7(c), the electrode pads 14a of the control chip 14 are arranged along sides of the circuit-formed surface 14X of the control chip. Thus, the electrode pads of each buffer chip 10 and the control chip 14 are arranged in a four-side pad array, while the electrode pads 12a of the memory chip 12 are arranged in a central pad array.

As shown in FIG. 8(a), a stud bump 11 is formed of, for example, gold (Au) as a salient electrode on each electrode pad 10a of each buffer chip 10. As shown in FIG. 8(b), a stud bump 13 is formed of, for example, Au as a salient electrode on each electrode pad 12a of each memory chip 12. Further, as shown in FIG. 8(c), a stud bump 15 is formed of, for example, Au as a salient electrode on each electrode pad 14a of the control chip 14. These stud bumps (11, 13, 15) are formed, for example, by a ball bonding method which uses Au wire and which utilizes both thermocompression bonding and ultrasonic oscillation. According to the ball bonding method, a ball is formed at the tip of Au wire and is then compression-bonded to an electrode pad on a chip under the application of ultrasonic oscillation, thereafter Au wire is cut off from the ball portion to form a bump. Thus, the stud bump formed on the electrode pad is firmly connected to the electrode pad.

In the top wiring layer of the soft layer 4 in the wiring board 1 are formed plural lines 5 (see FIG. 3), plural lines 6 (see FIG. 4), plural lines 7 (see FIG. 5), and plural electrode pads 8 (see FIG. 6), though these are not illustrated in detail.

As shown in FIG. 3, each of the plural lines 5 has a connection part 5a formed by a portion thereof, the connection parts 5a of the lines 5 being exposed through an opening 9a formed in the insulating film 9. The other portions of the lines 5 are covered with the insulating film 9. The connection parts 5a of the lines 5 are arranged correspondingly to the electrode pads 10a of each buffer chip 10.

As shown in FIG. 4, each of the plural lines 6 has a connection part 6a formed by a portion thereof, the connection parts 6a of the lines 6 being exposed through an opening 9b formed in the insulating film 9. The other portions of the lines 6 are covered with the insulating film 9. The connection parts 6a of the lines 6 are arranged correspondingly to the electrode pads 12a of each memory chip 12.

As shown in FIG. 5, each of the plural lines 7 has a connection part 7a formed by a portion thereof, the connection parts 7a of the lines 7 being exposed through an opening 9c formed in the insulating film 9. The other portions of the lines 7 are covered with the insulating film 9. The connection parts 7a of the lines 7 are arranged correspondingly to the electrode pads 14a of the control chip 14.

As shown in FIG. 6, plural electrode pads 8 are exposed through an opening 9d formed in the insulating film 9. The electrode pads 8 are formed by portions of plural lines formed in the top wiring layer of the soft layer 4, the other portions of the plural lines being covered with the insulating film 9.

The plural connection parts 5a, 6a, 7a, and the plural electrode pads 8 are arranged in bottoms of the openings 9a, 9b, 9c, and 9d, respectively. Thus, the wiring board 2 has the plural connection parts 5a, 6a, 7a and the plural electrode pads 8 exposed on a surface of the wiring board 2 at positions deeper than one main surface 2X in the depth direction from one main surface 2X.

As shown in FIG. 3, each buffer chip 10 is mounted in such a manner that its circuit-formed surface 10X confronts one main surface 2X of the wiring board 2. An anisotropic conductive resin 20, as an example of a bonding resin, is interposed between the buffer chip 10 and the wiring board 2. With the anisotropic conductive resin 20, the buffer chip 10 is bonded and fixed to the wiring board 2.

The plural stud bumps 11 are disposed between the electrode pads 10a of each buffer chip 10 and the connection parts 5a of the wiring board 2 to provide an electrical connection between the two. The stud bumps 11 are compression-bonded to the connection parts 5a of the wiring board 2 with a thermoshrinking force (a shrinking force developed upon return from a heated state to a state of normal temperature) or a thermocuring shrinking force (a shrinking force developed upon curing of a thermosetting resin) of the anisotropic conductive resin 20 interposed between the wiring board 2 and the buffer chip 10. A portion of a large number of conductive particles mixed into the anisotropic conductive resin 20 is interposed between the stud bumps 11 and the connection parts 5a of the wiring board 2.

The connection parts 5a of the wiring board 2 are each recessed in the depth direction of the wiring board 2. Each stud bump 11 and the associated connection part 5a are connected together in the interior of each such recess. By thus connecting the stud bump 11 and the connection part 5a in the interior of the recess, the volume of the anisotropic conductive resin 20 between one main surface 2X of the wiring board 2 and the circuit-formed surface 10X of each buffer chip 10 can be diminished by an amount corresponding to the depression quantity of the recess.

The stud bumps 11 are connected in the opening 9a formed in the insulating film 9 to the connection parts 5a disposed in the bottom of the opening 9a. That is, the stud bumps 11 are connected to the connection parts 5a which are disposed at a deeper position than one main surface 2X of the wiring board 2 in the depth direction from one main surface 2X. By thus disposing the connection parts 5a at a position deeper than the one main surface 2X of the wiring board 2, the volume of the anisotropic conductive resin 20 between one main surface 2X of the wiring board 2 and the circuit-formed surface 10X of the buffer chip 10 can be diminished by an amount corresponding to the depth from one main surface 2X to the connection parts 5a.

The recess of each connection part 5a is formed by an elastic deformation of the connection part 5a and the soft layer 4. The recess thus based on such an elastic deformation can be formed with a compression-bonding force used at the time of mounting the buffer chip 10 onto one main surface of the wiring board 2. In case of forming the recess by an elastic deformation of each connection part 5a and the soft layer 4, an elastic force of the connection part 5a and the soft layer 4 acts on the associated stud bump 11, so that the compression-bonding force between the stud bump 11 and the connection part 5a increases.

Even if the spacing between one main surface 2X of the wiring board 2 and the circuit-formed surface 10X of the buffer chip 10 expands due to expansion in the thickness direction of the anisotropic conductive resin 20 and the stud bumps move upward accordingly, the depression quantity of the recess in each connection part 5a varies following the movement of the associated stud bump 11, so that the connection parts 5a of the wiring board 5 and the stud bumps 11 can be kept connected.

As shown in FIG. 4, each memory chip 12 is mounted in a state such that its circuit-formed surface 12X confronts one main surface 2X of the wiring board 2. For example, anisotropic conductive resin 20 is interposed as a bonding resin between the memory chip 12 and the wiring board 2 and the memory chip 12 is bonded and fixed to the wiring board 2.

The plural stud bumps 13 are each disposed between each electrode pad 12a of the memory chip 12 and each connection part 6a of the wiring board 2 to provide an electric connection between the two. The stud bumps 13 are compression-bonded to the connection parts 6a of the wiring board 2 with a thermoshrinking force or a thermocuring shrinking force of the anisotropic conductive resin 20 interposed between the wiring board 2 and the memory chip 12. A portion of a large number of conductive particles mixed into the anisotropic conductive resin 20 is interposed between the stud bumps 13 and the connection parts 6a of the wiring board 1.

The connection parts 6a of the wiring board 2 are each recessed in the depth direction of the wiring board, and each stud bump 13 and the associated connection part 6a are connected together in the interior of each such recess as is the case with the buffer chip 10. The stud bumps 13 are connected through the opening 9b formed in the insulating film 9 to the conenctions 6a disposed in the bottom of the opening 9b. Thus, similarly to the case with the buffer chip 10, the stud bumps 13 are connected to the connection parts 6a which are disposed in a deeper position than one main surface 2X of the wiring board 2 in the depth direction from one main surface 2X.

As shown in FIG. 5, the circuit-formed surface 14X of the control chip 14 is mounted in a state such that its circuit-formed surface 14X confronts one main surface 2X of the wiring board 2. Between the control chip 14 and the wiring board 2 is interposed, for example, an anisotropic conductive resin 20 as a bonding resin, and with this anisotropic conductive resin 20 the control chip 14 is bonded and fixed to the wiring board 2.

The plural stud bumps 15 are each disposed between each electrode pad 14a of the control chip 14 and each connection part 7a of the wiring board 2 to provide an electrical connection between the two. The stud bumps 15 are compression-bonded to the connection parts 7a of the wiring board 2 with a thermoshrinking force or a thermocuring shrinking force of the anisotropic conductive resin 20 interposed between the wiring board 2 and the control chip 14. Between the stud bumps 15 and the connection parts 7a of the wiring board 2 is interposed a portion of a large number of conductive particles mixed into the anisotropic conductive resin 20.

The connection parts 7a of the wiring board 2 are recessed in the depth direction of the wiring board 2, and as the case with each buffer chip 10, each stud bump 15 and the associated connection 7a are connected together in the interior of each such recess. The stud bumps 15 are connected through the opening 9c formed in the insulating film 9 to the connection parts 7a disposed in the bottom of the opening 9c. That is, as is the case with the buffer chip 10, the stud bumps 15 are connected to the connection parts 7a disposed at a deeper position than one main surface 2X of the wiring board 2 in the depth direction from one main surface 2X.

As shown in FIG. 6, electrodes 17a of the capacitors 17 are connected to the electrode pads 8 electrically and mechanically by solder 21. To control wetting and spreading of the solder 21, the connection between the capacitor electrodes 17a and the electrode pads 8 of the wiring board 2 is performed through the opening 9d formed in the insulating film 9. The capacitors 18 and resistors 19 are also mounted in the same way as in the mounting of the capacitors 17.

As shown in FIG. 7, a pad array pitch P1 of each buffer chip 10 is set at 110 [μm] or so. Pad array pitches P2, P3 of each memory chip 12 and the control chip 14 are set at 80 [μm] or so. A plane size of each chip electrode pad depends on the pad array pitch and the narrower the pad array pitch, the smaller the plane size. On the other hand, the size of each stud bump formed on each chip electrode pad depends on the plane size of each electrode pad and the smaller the plane size of each electrode pad, the lower the stud bump height. That is, the stud bumps 13, 15 formed on the electrode pads of each memory chip 12 and the control chip 14 are smaller in height than the stud bumps 11 formed on the electrode pads of each buffer chip 10.

In the case of a chip wherein the stud bump height is larger than the depth from one main surface 2X of the wiring board 2 to the connection parts 5a, 6a, 7a of the same board, the connection parts of the wiring board 2 and the stud bumps can be connected together easily, but in the case of a chip wherein the stud bump height is smaller than the depth from one main surface 2X of the wiring board 2 to the connection parts of the same board, the connection parts of the wiring board 2 and the stud bumps are difficult to be connected.

Therefore, in a chip having a narrow pad array pitch, namely, having a small plane size of electrode pads, the adoption of a multi-stage stud bump structure is effective in increasing the bump height. In this embodiment, as shown in FIG. 3, the stud bumps 11 of each buffer chip 10 are of a single stage bump structure. As shown in FIG. 4, the stud bumps of each memory chip 12 are each of a two-stage bump structure having a base bump 13a formed on each electrode pad 12a and a stack bump 13b stacked on the base bump 13a. As shown in FIG. 5, the stud bumps 15 of the control chip 14 are each of a two-stage bump structure having a base bump 15a formed on each electrode pad 14a and a stack bump 15b stacked on the base bump 15a. As shown in FIG. 8, the height T1 of each stud bump 11, the height T2 of each stud bump 13, and the height T3 of each stud bump 15 are almost equal.

By thus setting the chips different in array pitch almost equal in stud bump height, the stud bumps 13, 15 can be connected to the connection parts 6a, 7a of the wiring board 2 also in the memory chips 12 and control chip 14 which are narrow in pad array pitch.

As shown in FIG. 7(b), electrode pads 12b of each memory chip 12 are arranged in a central pad array. Also, the stud bumps 13 formed on the electrode pads 12b are arranged in a central bump array. Thus, in the case where the memory chip 12 with the stud bumps 13 arranged in a central bump array is used in flip chip mounting, the memory chip 12 tilts with respect to the main surface 2X of the wiring board 2 because the chip 12 is not well-balanced.

Effective as a measure against such unbalanced bump array in the memory chip 12 is to arrange the connection parts 6a of the wiring board 2 at a deeper position than one main surface 2X of the wiring board 2 in the depth direction from one main surface. In this embodiment, as shown in FIG. 4, the connection parts 6a are defined in a deeper position than one main surface 2X of the wiring board 2 by the insulating film 9 which is formed above the connection parts 6a. By so arranging the connection parts 6a, at the time of flip-chip-mounting the memory chip 12, the height of the stud bumps 13 is absorbed by the depth from one main surface 2X of the wiring board 2 to the connection parts 6a, so that the spacing between one main surface 2X of the wiring board and the circuit-formed surface 12X of the memory chip 12 becomes narrow and hence it is possible to suppress the tilt of the memory chip with respect to one main surface 2X of the wiring board 2.

For disposing the connection parts 6a at a deeper position than one main surface 2X of the wiring board 2 and thereby suppressing the tilt of the memory chip 12 relative to one main surface 2X of the wiring board, it is necessary to form the insulating film 9 and the opening 9b in such a manner as to be present straddling the peripheral edge of the memory chip 12. That is, the plane size of the insulating film 9 is set larger than that of each memory chip 12 and the plane size of the opening 9b is made smaller than that of the memory chip 12, as shown in FIG. 10. In this embodiment, the insulating film 9 is formed in a plane size which covers substantially the whole area of the wiring board 2, and the opening 9b is formed in a plane size smaller than the plane size of the memory chip 12. Further, the opening 9b is formed in a rectangular plane shape extending in the arranged direction of the connection parts 6a of the wiring board 2.

Next, a method of manufacturing the MCM 1 will be described below with reference to FIGS. 11 to 15.

Figure 11A:
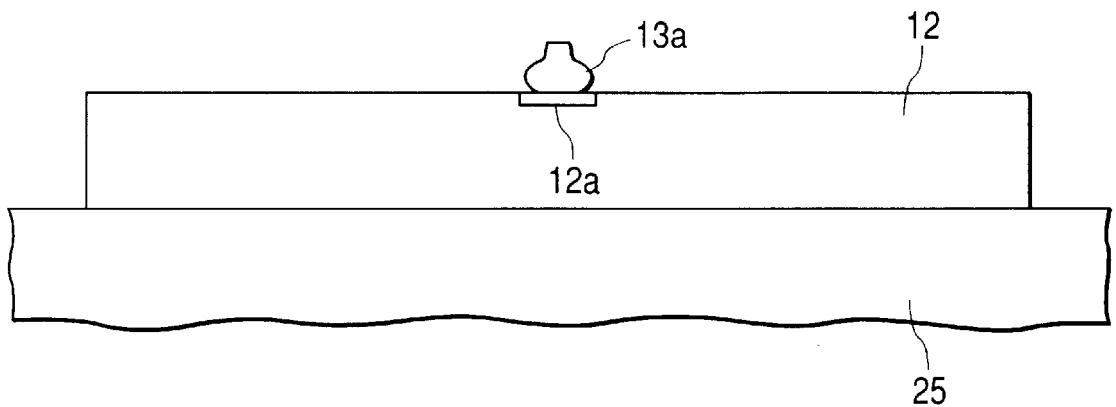
FIGS. 11(a) and 11(b) are schematic sectional views for explaining a process of forming a stud bump on an electrode pad in the chip for memory in manufacturing the MCM according to the first embodiment.
Figure 11B:
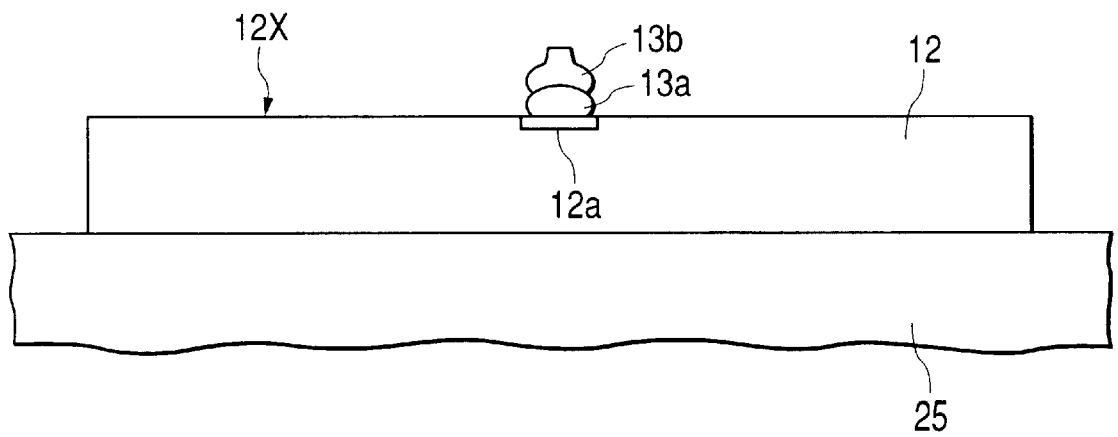
Figure 12:
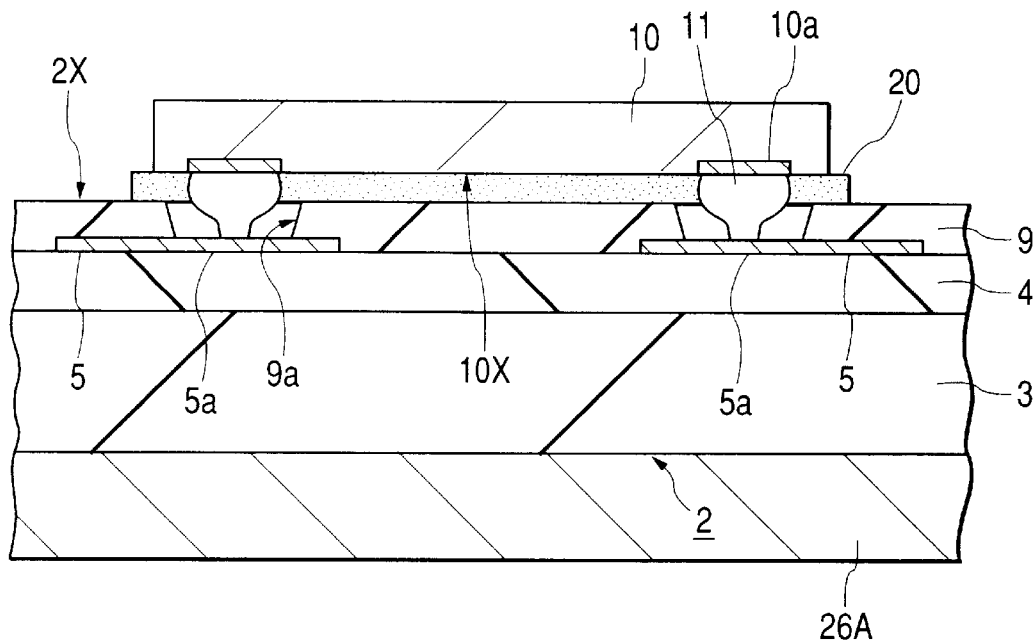
FIG. 12 is a schematic sectional view for explaining a process of mounting the chip for buffer in manufacturing the MCM according to the first embodiment.
Figure 13:
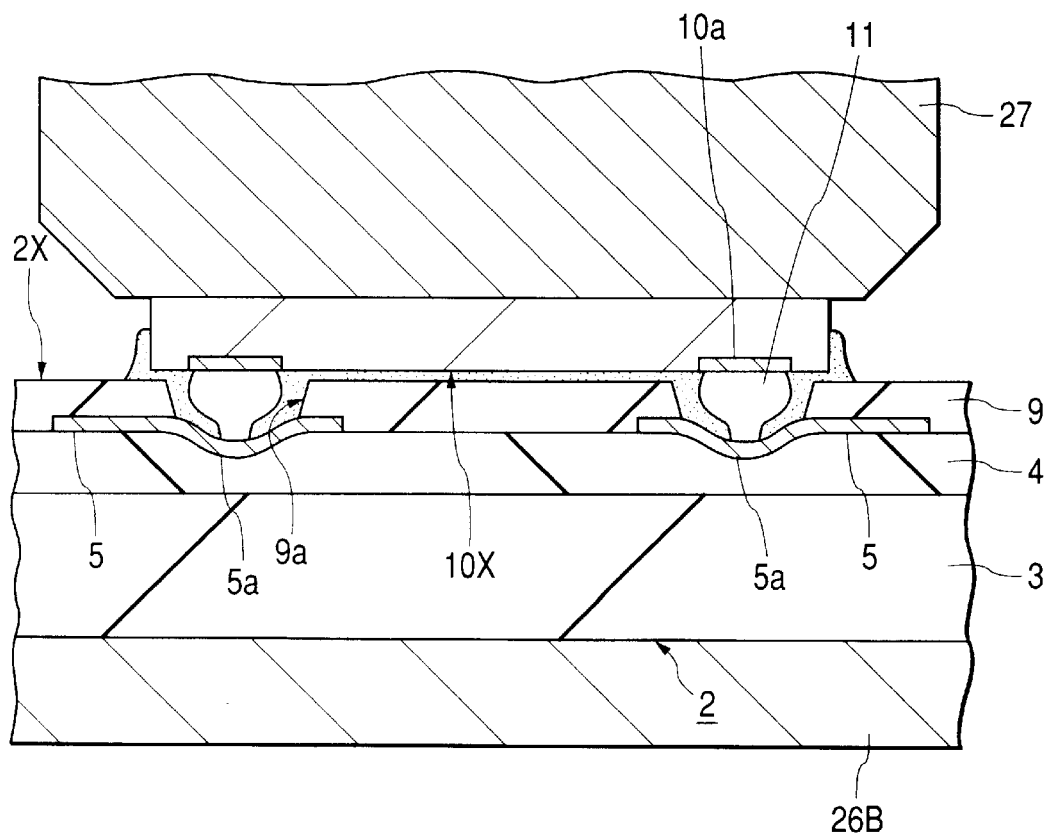
FIG. 13 is a schematic sectional view for explaining the buffer chip mounting process in manufacturing the MCM according to the first embodiment.
Figure 14:
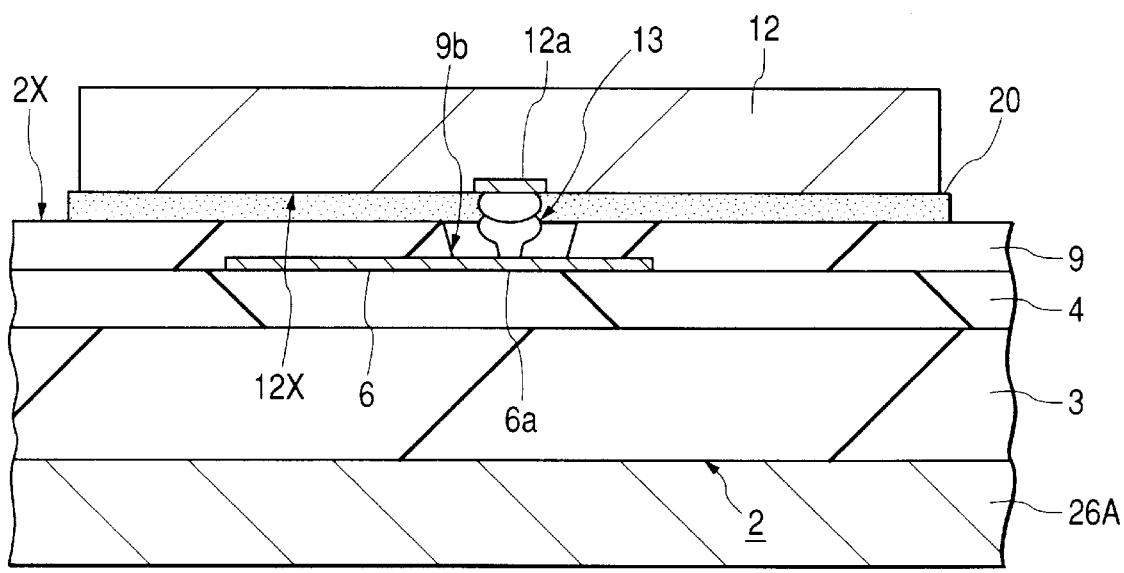
FIG. 14 is a schematic sectional view for explaining a process of mounting the chip for memory in manufacturing the MCM according to the first embodiment.
Figure 15:
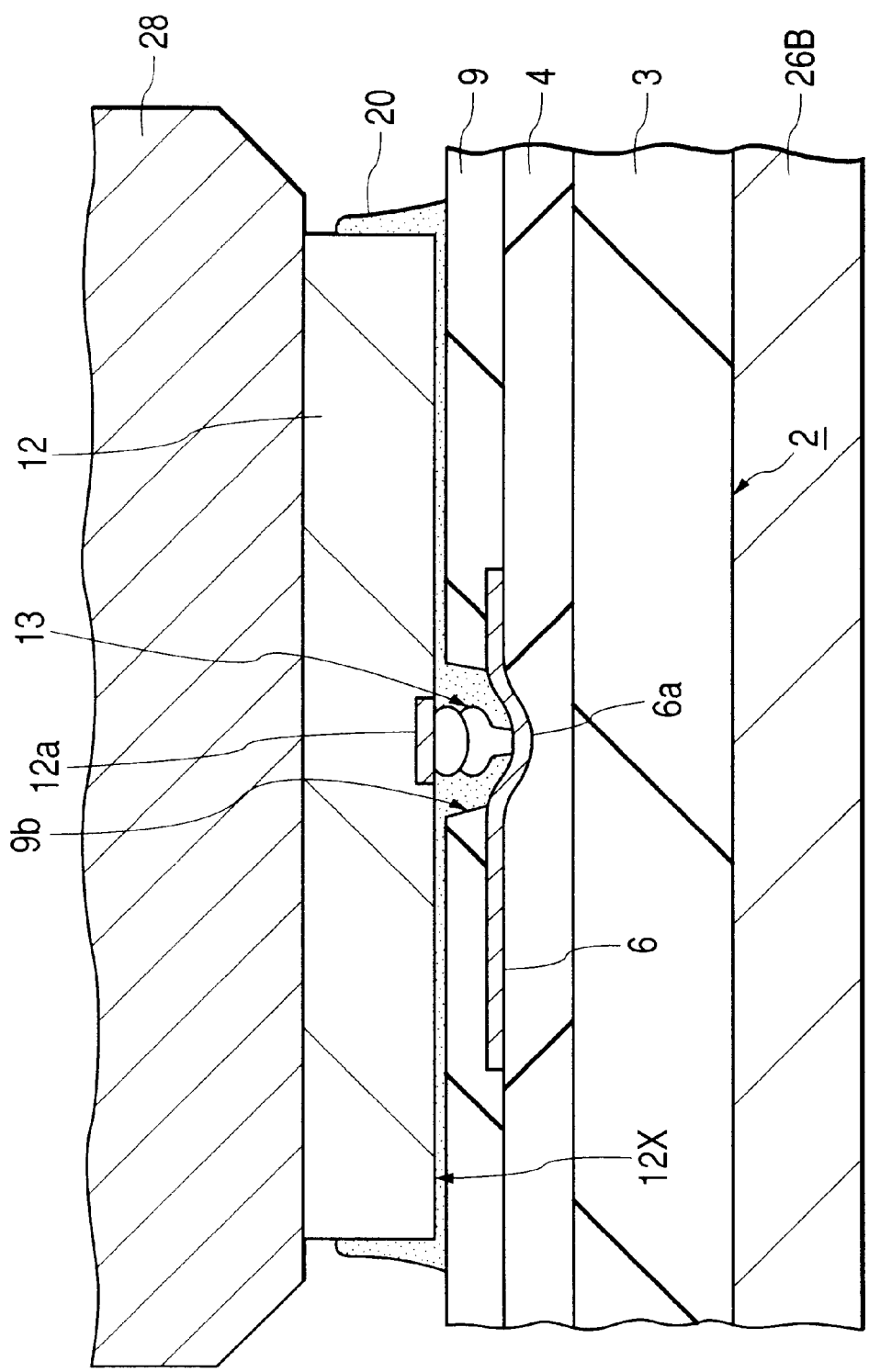
FIG. 15 is a schematic sectional view for explaining the memory chip mounting process in manufacturing the MCM according to the first embodiment.

FIGS. 11(a) and 11(b) are schematic sectional views for explaining a process of forming a stud bump of a multistage bump structure, FIG. 12 is a schematic sectional view for explaining a buffer chip mounting process, FIG. 13 is a schematic sectional view for explaining the buffer chip mounting process, FIG. 14 is a schematic section view for explaining a memory chip mounting process, and FIG. 15 is a schematic sectional view for explaining the memory chip mounting process.

First, electronic components 10, 12, 14, 16, 17, 18, 19 to be mounted on the wiring board 2 are provided.

Next, stud bumps are formed on the electrode pads of the buffer chips 10, memory chips 12, control chip 14 and arithmetic chip 16 in accordance with the ball bonding method. For the buffer chips 10 and arithmetic chip 16 there are formed stud bumps of a single stage bump structure. For the memory chips 12 and control chip 14 there are formed stud bumps of a multi-stage bump structure (two stages in this embodiment). With each memory chip 12 as an example, a description will now be given about a method of forming a stud bump of a two-stage bump structure. First, a memory chip 12 is mounted on a heat stage 25, then as shown in FIG. 11(a), a base bump 13a is formed on an electrode pad 12a of the memory chip 12 in accordance with the ball bonding method, and thereafter a stack bump 13b is formed on the base bump 13a, as shown in FIG. 11(b). By further forming a stack bump on the stack bump 13b there can be formed a stud bump of a three- or more stage bump structure.

Next, an anisotropic conductive resin 20 which has been processed in sheet (film) form is affixed to a buffer chip mounting area on one main surface 2X of the wiring board 2. As the anisotropic conductive resin 20 there is used, for example, an epoxy thermosetting resin with a large number of conductive particles mixed therein.

Next, the wiring board 2 is mounted onto a stage 26A and thereafter, as shown in FIG. 12, the buffer chip 10 is mounted through the anisotropic conductive resin 20 in the buffer chip mounting area on one main surface 2X of the wiring board 2. The mounting of the buffer chip 10 is performed in such a manner that its circuit-formed surface 10X confronts one main surface 2X of the wiring board 2.

Next, the wiring board 2 is mounted onto a heat stage 26B, then, as shown in FIG. 13, the buffer chip 10 is compression-bonded onto the wiring board under heating with use of a tool 27, allowing each stud bump 11 to be connected to the associated connection part 5a of the wiring board 2, and this compression-bonded state is maintained until curing of the anisotropic conductive resin 20. At this time, the stud bump 11 is compression-bonded to the connection part 5a of the wiring board 2. In this process, by setting the depth from one main surface 2X of the wiring board 2 to the connection part 5a shallower than the height of the stud bump 11, a recess is formed in the stud bump 11-connected portion in the connection part 5a with the compression-bonding force of the buffer chip 10. In the interior of the recess the connection part 5a of the wiring board 2 and the stud bump 11 are connected together. Since the recess is formed by an elastic deformation of the connection part 5a and the soft layer 4, an elastic force of the connection part 5a and the soft layer 4 acts on the stud bump 11.

Next, by the same mounting method as that for the buffer chip 10, the arithmetic chip 16 is mounted in an arithmetic chip mounting area on one main surface 2X of the wiring board 2.

Next, an anisotropic conductive resin 20 which has been processed in sheet (film) form is affixed to the memory chip mounting area on one main surface 2X of the wiring board 2. As the anisotropic conductive resin 20 there is used, for example an epoxy thermosetting resin with a large number of conductive particles mixed therein.

Next, the wiring board 2 is mounted onto the stage 26A, thereafter, as shown in FIG. 14, the memory chip 12 is mounted through the anisotropic conductive resin 20 in a memory chip mounting area on one main surface 2X of the wiring board 2. The mounting of the memory chip 12 is performed so that its circuit-formed surface 12X confronts one main surface 2X of the wiring board.

Next, the wiring board is mounted onto the heat stage 26B, thereafter, as shown in FIG. 15, the memory chip 12 is compression-bonded onto the wiring board under heating with use of a tool 28, allowing a stud bump 13 to be connected to the associated connection part 6a, and then this compression-bonded state is held until curing of the anisotropic conductive resin 20. At this time, the stud bump 13 is compression-bonded to the connection part 6a of the wiring board 2. In this process, as is the case with the buffer chip 10, a recess is formed with the compression-bonding force of the memory chip 12 in the portion of the connection part 6a to which the stud bump 13 is connected. Each connection part 6a of the wiring board 2 and the associated stud bump 13 are connected together in the interior of the recess. Since the recess is formed by an elastic deformation of the connection part 6a and the soft layer 4, an elastic force of the connection part 6a and the soft layer 4 acts on the stud bump 13.

In this process, moreover, since each stud bump is of a multi-stage bump structure, the stud bump can be connected to the associated connection part 6a of the wiring board 2 even in the memory chip 12 whose pad array pitch is narrow.

Further, in this process, since the connection part 6a is located at a position deeper than one main surface 2X of the wiring board 2 by the insulating film 9 which is formed above the connection part 6a, the height of the stud bump 13 is absorbed by the depth from one main surface 2X of the wiring board 2 to the connection part 6a and hence the spacing between one main surface 2X of the wiring board 2 and the circuit-formed surface 12X of the semiconductor chip 12 becomes narrow. If the spacing between one main surface 2X of the wiring board and the memory chip circuit-formed surface 12X becomes narrow, even if the memory chip 12 tilts in the course of the mounting process for example, one main surface 2X of the wiring board supports the memory chip 12, and thus it is possible to prevent the memory chip 12 from tilting to such an extent as poses a problem in the structure after the mounting.

Where a particulate substance such as conductive particles or silica filler is contained in the bonding resin for bonding the chip, the particulate substance is sandwiched between one main surface 2X of the wiring board 2 and the circuit-formed surface 12X of the memory chip 12, so that the tilting of the memory chip 12 in the semiconductor chip mounting process is further suppressed.

Also, when the viscosity of the bonding resin 20 in the semiconductor chip mounting process is high, the tilting of the memory chip 12 is suppressed with a resisting force against flowing of the bonding resin. Thus, by any of such mechanisms it is possible to suppress tilting of the memory chip 12 with respect to one main surface 2X of the wiring board 2.

Next, by the same mounting method as that for the memory chip 12, the control chip 14 is mounted in a control chip mounting area on one main surface 2X of the wiring board 2. Also in the control chip 14 whose pad array pitch is narrow, each stud bump 15 can be connected to the associated connection part 7a of the wiring board 2.

The chip mounting order is not limited to the above order. For example, the memory chip and the control chip may be mounted first.

Next, solder paste 21 is applied onto the electrode pads 8 of the wiring board 2, and then passive components 17, 18, 19 are disposed on the electrode pads, followed by heat treatment to melt the solder paste 21 to fix the electrodes of the passive components and the electrode pads of the wiring board 2 to each other.

Then, ball-like solder bumps 22 as connecting terminals are formed respectively on the surfaces of plural electrode pads disposed on the back side opposed to one main surface of the wiring board 2, whereby the MCM 1 of this embodiment is almost completed.

Thus, according to this embodiment there are obtained the following effects.

(1) In the MCM 1, the plural connection parts 6a are disposed at a deeper position than one main surface 2X of the wiring board 2 in the depth direction from one main surface 2X. According to this configuration, at the time of flip-chip-mounting the unbalanced bump-array memory chip 12, the height of the stud bumps 13 is absorbed by the depth from one main surface 2X of the wiring board 2 to the connection parts 6a, with consequent narrowing of the spacing between one main surface 2X of the wiring board 2 and the circuit-formed surface 12X of the memory chip 12, whereby it is possible to suppress tilting of the memory chip 12 with respect to one main surface 2X of the wiring board 2.

(2) In the MCM 1, the wiring board 2 has the insulating film 9 comprising one main surface 2X on its own top surface, the opening 9b formed in the insulating film 9, and the connection parts 6a disposed in the bottom of the opening 9b. The insulating film 9 controls wetting and spreading of solder for soldered components (17, 18 and 19 in this embodiment) at the time of mounting of the components and ensures a sufficient bonding force of flip chip components (10, 12 and 14 in this embodiment) at the time of mounting of the components. According to this configuration, it is possible to easily form the wiring board 2 wherein plural connection parts 6a are disposed at a deeper position than one main surface 2X of the wiring board 2 in the depth direction from one main surface 2X, so that it is possible to provide the MCM 1 wherein unbalanced bump-array memory chips 12 are mounted on one main surface 2X of the wiring board 2 in accordance with the flip-chip method.

(3) In the MCM 1, the stud bumps 13, 15 of the memory chips 12 and control chip 14 each having a narrow pad array pitch are of a multi-stage bump structure. According to this configuration, even in the memory chips 12 and control chip 14 each having a narrow pad array pitch, the stud bumps (13, 15) can be connected to the connection parts (6a, 7a) of the wiring board 2, so that the buffer chips 10, memory chips 12, control chip 14 and arithmetic chip 16, which are different in pad array pitch, can be mounted on a single wiring board 2.

Figure 16:
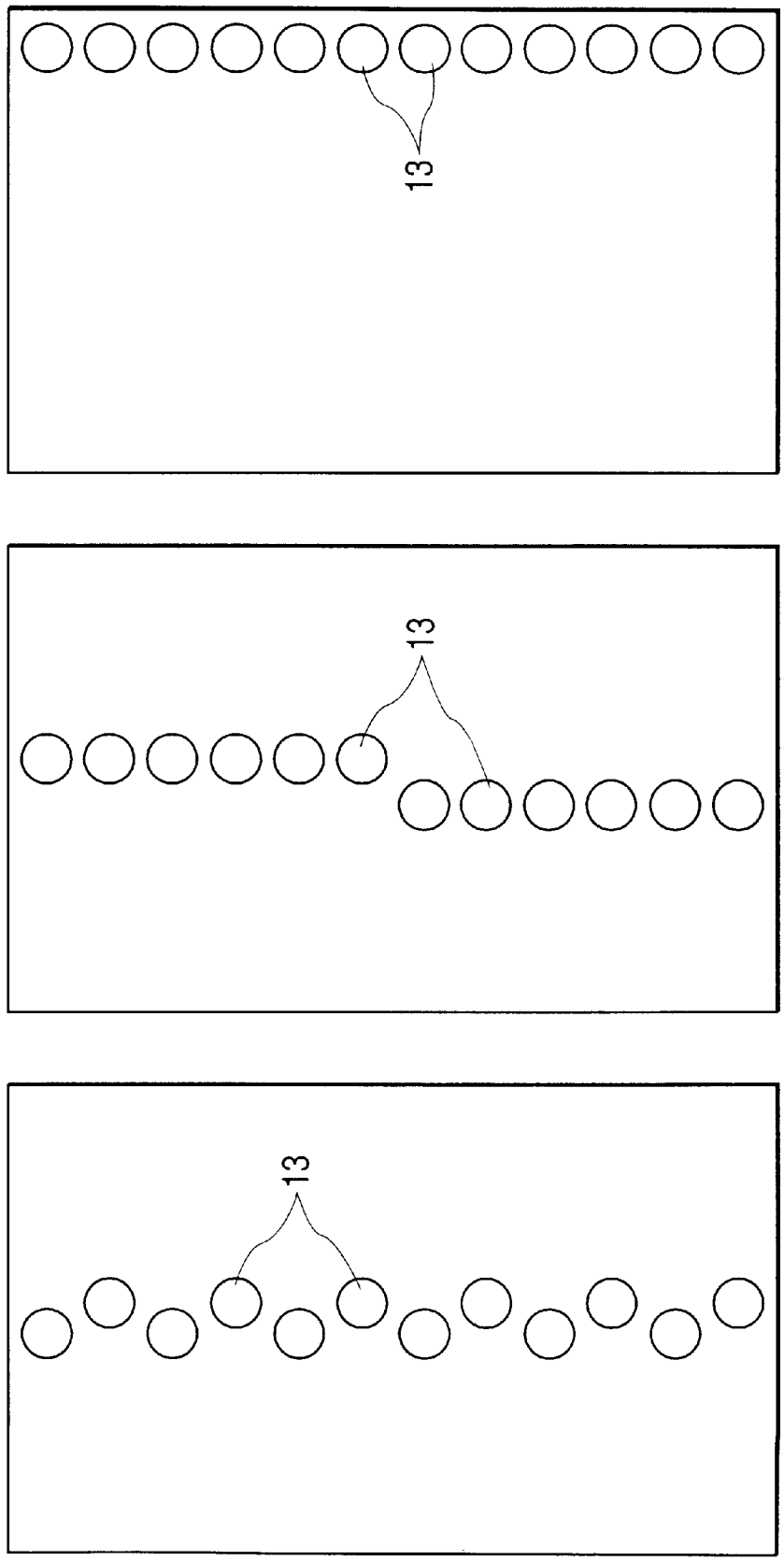
FIGS. 16(a), 16(b) and 16(c) are schematic plan views of a chip for memory showing another bump array pattern in the MCM according to the first embodiment.

Although in this embodiment a central bump array has been described as an example of an unbalanced bump array on a chip, there are such other unbalanced bump arrays on a chip shown in FIGS. 16(a)–16(c). FIG. 16(a) shows a central bump array wherein plural stud bumps 13 are arranged in a zigzag fashion. FIG. 16(b) shows a central bump array wherein plural stud bumps 13 are arranged in different stages. FIG. 16(c) shows a one-side bump array. Further examples of unbalanced bump arrays on a chip include one wherein a circuit-formed surface of a chip is divided into three equal areas and stud bumps are arranged in one of the three areas and one wherein the center of gravity of a semiconductor chip lies outside a polygon formed by joining bumps.

Figure 17:
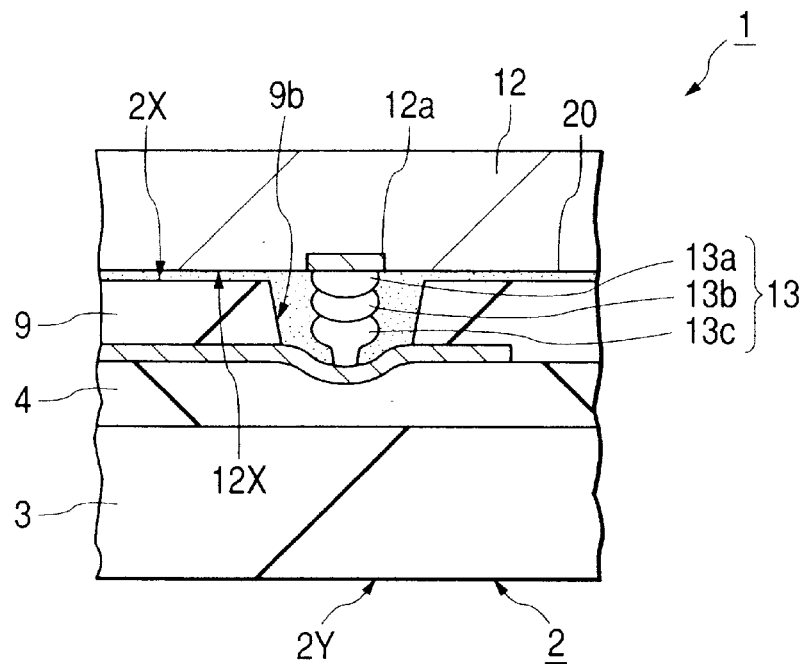
FIG. 17 is a schematic sectional view showing a mounted state of a chip for memory incorporated in an MCM according to the first modification of the first embodiment.

The stud bumps 13 used in this embodiment are of a two-stage bump structure to increase their height, but according to the depth from one main surface 2X of the wiring board 2 to the connection parts 6a and a plane size of each electrode pad 12a, there may be adopted such a three-stage bump structure as shown in FIG. 17 wherein a stud bump 13 comprises a base bump 13a connected to an electrode pad 12a, a stack bump 13b stacked on the base bump 13a, and a stack bump 13c stacked on the stack bump 13b.

Figure 18:
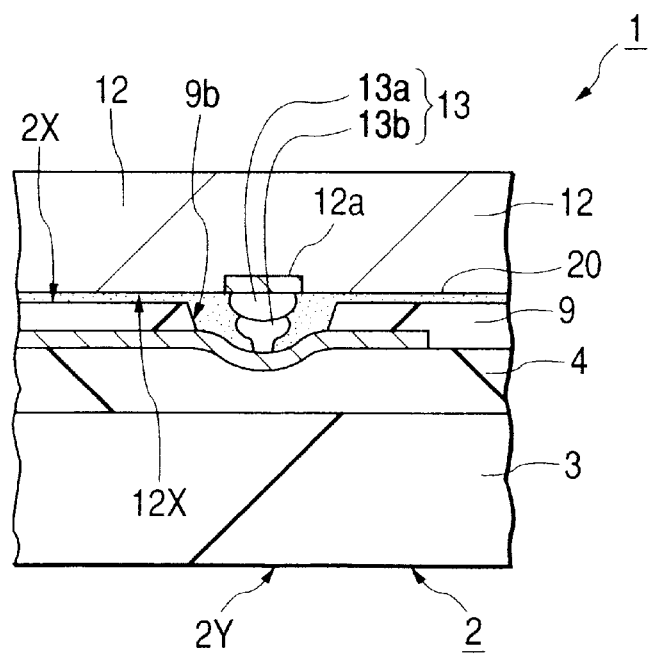
FIG. 18 is a schematic sectional view showing a mounted state chip for memory incorporated in an MCM according to the second modification of the first embodiment.

Although in the two-stage bump structure adopted in this embodiment the base bump 13a and the stack bump 13b are almost equal in diameter, there may be adopted such a two-stage bump structure as shown in FIG. 18 which uses a stud bump 13 comprising a base bump 13a and a stack bump 13b different in diameter. In this case, by using Au wires of different diameters at the time of forming stud bumps in accordance with the ball bonding method there can be obtained a base bump 13a and a stack bump 13b different in diameter.

Although in this embodiment stud bumps are used as salient electrodes formed on electrode pads of each semiconductor chip, no limitation is made thereto. For example, there may be used solder bumps having a composition of Pb-Sn. In this case, the solder bumps used are made of a material melting higher than the thermocompression bonding temperature which is adopted in mounting the semiconductor chip.

Although in this embodiment the salient electrodes interposed between the electrode pads of each semiconductor chip and the connection parts of the wiring board are formed beforehand on the electrode pads of the chip, the salient electrodes may be formed beforehand on the connection parts of the wiring board.

Although in this embodiment a sheet-like anisotropic conductive resin is used as the bonding resin for bonding and fixing each semiconductor chip onto the wiring board, this constitutes no limitation. For example, there may be used an anisotropic conductive resin paste (ACP: Anisotropic Conductive Paste) or a sheet-like non-conductive resin (NCF: Non Conductive Film).

Figure 19:
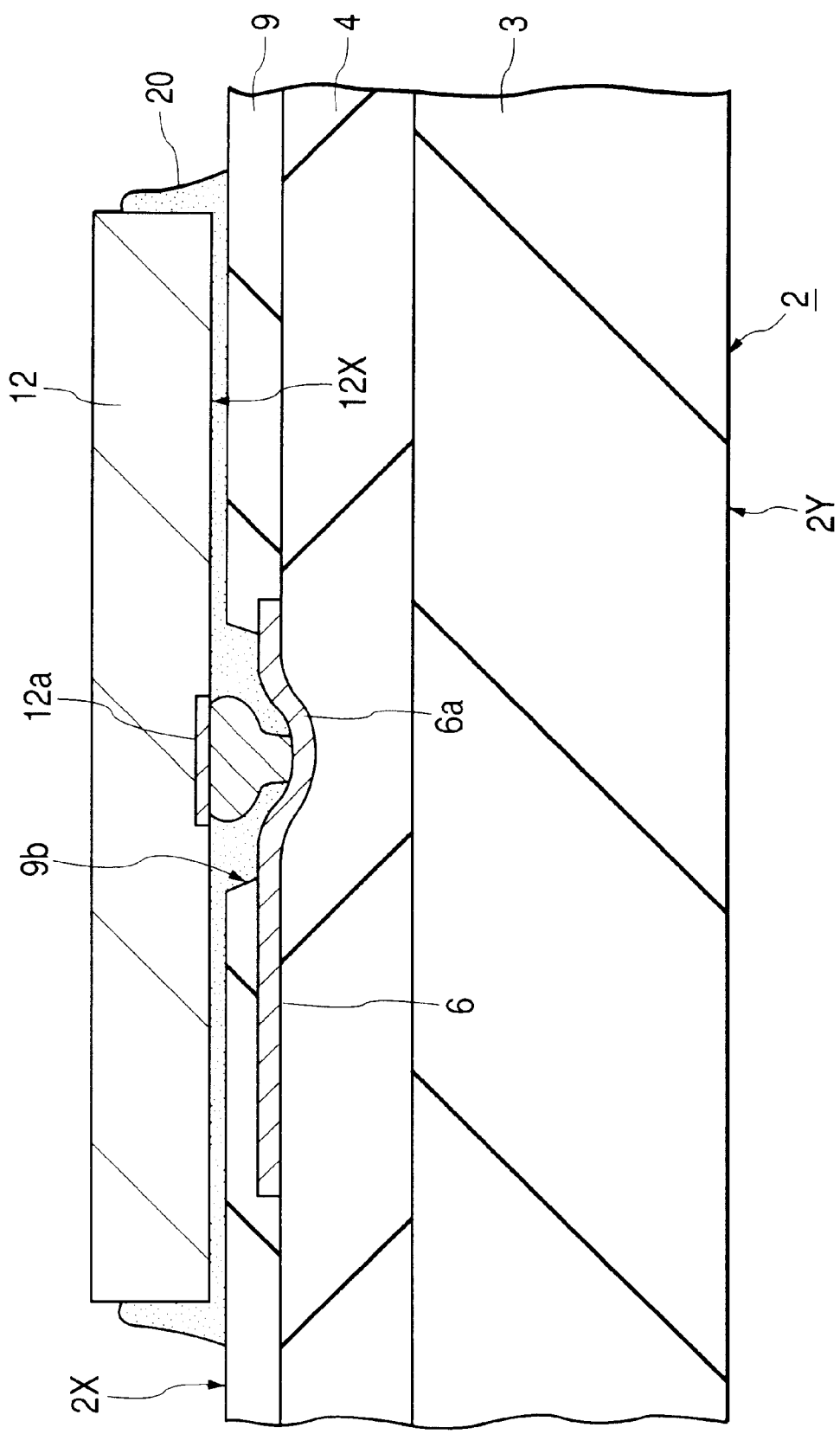
FIG. 19 is a schematic sectional view showing a chip for memory incorporated in an MCM according to the second embodiment of the present invention.
Figure 20:
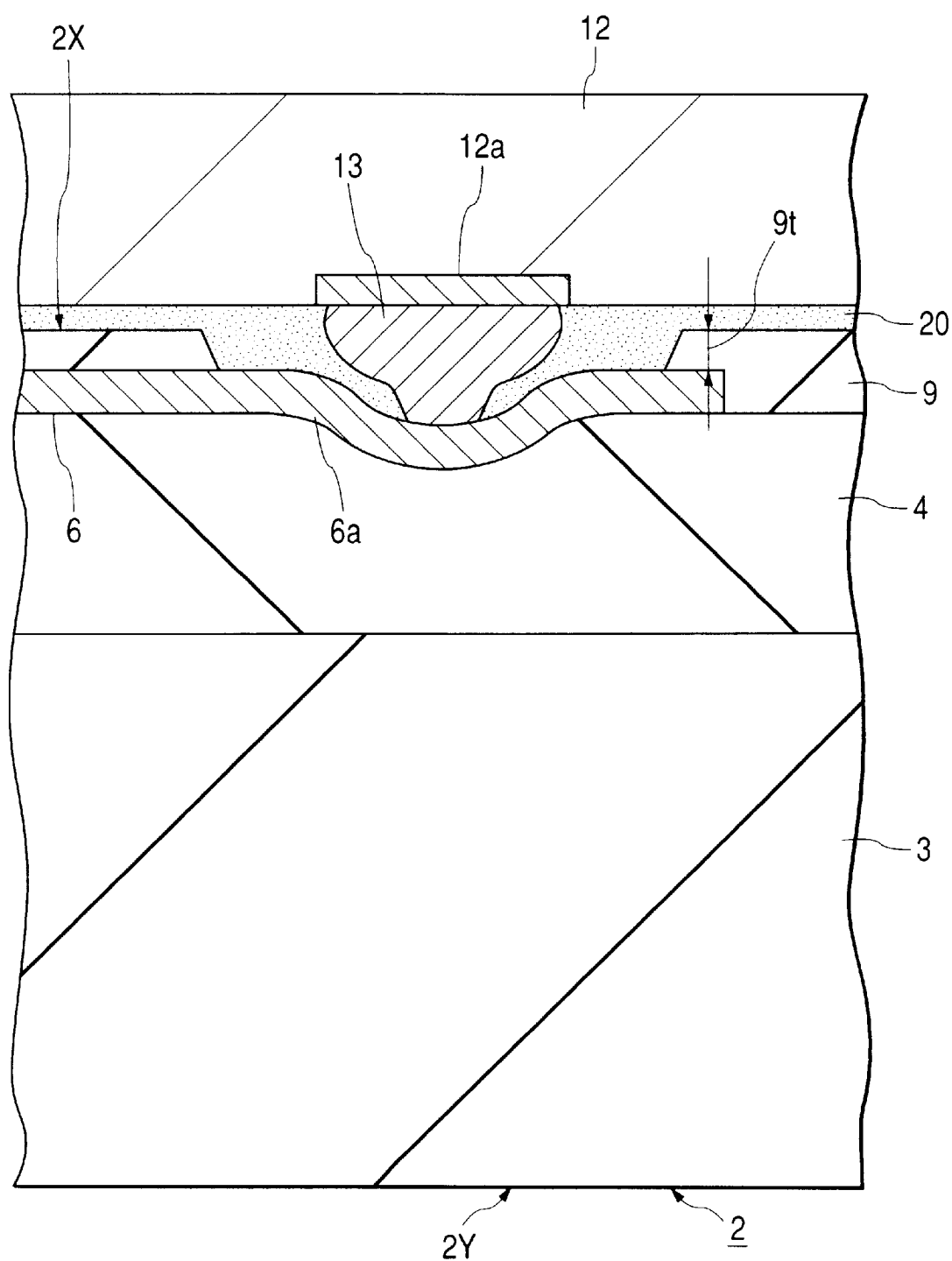
FIG. 20 is a partially enlarged schematic sectional view of FIG. 19.
Figure 21:
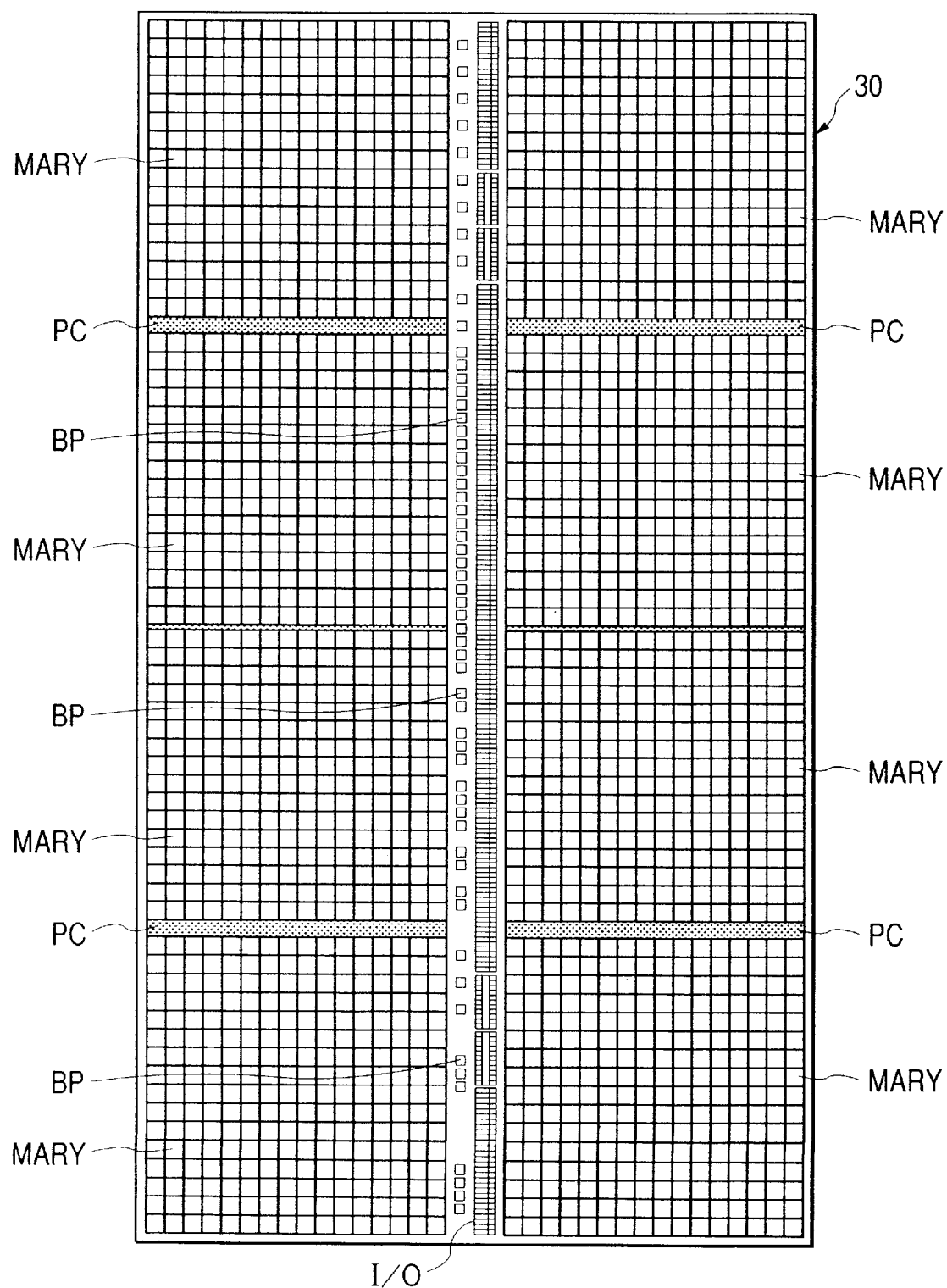
FIG. 21 is a planar layout diagram of a conventional DRAM chip.

Now, a description will be given about the improvement of connection reliability in a moisture resistance test, with reference to FIGS. 19 and 20. FIG. 19 is a schematic sectional view showing a mounted state of a memory chip in an MCM according to the second embodiment of the present invention and FIG. 20 is a schematic sectional view showing a part of FIG. 19 on a larger scale. Stud bumps 13 used in this embodiment are of a single-stage structure.

In a flip-chip mounting structure using the anisotropic conductive resin 20, it is important to ensure a high connection reliability in a moisture resistance test. Having evaluated moisture resistance for different thicknesses of the insulating film 9 in the wiring board 2, the present inventors found out that the connection life between the connection parts 6a of the wiring board 2 and the stud bumps 13 was improved by thinning the insulating film 9. This is presumed to be for the following reason.

In the ACF mounting method, with reference to a memory chip 12 as an example, the memory chip 12 is put on the wiring board 2 through the anisotropic conductive resin 20 and is then compression-bonded onto the wiring board under heating, whereby it is fixed onto the wiring board, while stud bumps 13 are connected electrically to the connection parts 6a of the wiring board 2. At this time, the anisotropic conductive resin 20 is charged into the opening 9b formed in the insulating film 9. The anisotropic conductive resin 20 possesses a characteristic such that after curing thereof, its volume expands due to moisture absorption. The anisotropic conductive resin 20 charged into the opening 9b in the stud bumps is thicker than the anisotropic conductive resin 20 charged between one main surface 2X of the wiring board 2 and the circuit-formed surface 12X of each memory chip 12, so that the amount of displacement resulting from expansion caused by moisture absorption also becomes large. When the recovery from an elastic deformation of the soft layer 4 in the wiring board 2 can no longer follow the displacement between one main surface 2X of the wiring board 2 and the circuit-formed surface 12X of the memory chip 12 which displacement is caused by a hygroscopic expansion of the anisotropic conductive resin 20, there occurs connection imperfection between the stud bumps 13 and the connection parts 6a of the wiring board 2. Since the depth of the opening 9b depends on the thickness of the insulating film 9, the thinner the insulating film 9, the shallower the opening 9b, so that the volume of the anisotropic conductive resin 20 in the interior of the opening 9b becomes smaller. Thus, it is presumed that the connection life between the connection parts 6a of the wiring board and the stud bumps 13 is improved by thinning the insulating film 9.

The following are an example of evaluation results obtained under the conditions of temperature 85° C. and humidity 85%.

(1) When the thickness 9t (see FIG. 20) of the insulating film 9 on a line 6 was set at 25 [$\mu$m], the connection life was 96 h.

(2) When the thickness 9t of the insulating film 9 on the line 6 was set at 20 [$\mu$m], the connection life was not shorter than 500 h.

(3) When the thickness 9t of the insulating film 9 on the line 6 was set at 15 [$\mu$m], the connection life was not shorter than 500 h.

Judging from the above results, it is preferable that the thickness 9t of the insulating film 9 on the line 6 be not larger than 20 [$\mu$m].

As the case may be, a large number of fillers are mixed into the insulating film 9. In such a case, it is necessary that the thickness 9t of the insulating film 9 on the line 6 be made larger than the filler of the largest particle diameter out of the fillers mixed into the insulating film. If the thickness 9t of the insulating film 9 is made smaller than the filler of the largest particle diameter, the filler will jump out from the insulating film 9.

When the stud bumps 13 are made small for reliability improvement and the thickness 9t of the insulating film 9 is made small accordingly, if the insulating film thickness 9t becomes so small as to be unsuitable for controlling wetting and spreading of solder of soldered components formed in surrounding positions, the insulating film thickness may be changed so as to be optimum, depending on places on the wiring board 2.

Although the present invention has been described above concretely on the basis of the above embodiments, it is apparent that the invention is not limited to those embodiments and that various modifications may be made within the scope not departing from the basic principles of the invention.

The following is a brief description of typical effects attained by the present invention.

It is possible to suppress tilting of a semiconductor chip relative to one main surface of a wiring board.

Plural types of semiconductor chips different in array pitch can be mounted on a single wiring board.

What is claimed is:

1. An electronic device comprising:
 a first semiconductor chip having a plurality of first electrode pads arranged at a first array pitch on one main surface of the chip;
 a second semiconductor chip having a plurality of second electrode pads arranged at a second array pitch smaller than the first array pitch on one main surface of the chip;
 a wiring board having in a first area of a surface thereof a plurality of first connection parts arranged correspondingly to the plural first electrode pads and in a second area of said surface thereof different from the first area a plurality of second connection parts arranged correspondingly to the plural second electrode pads;
 a plurality of first salient electrodes disposed respectively between the first electrode pads and the first connection parts and providing electric connections between the two; and
 a plurality of second salient electrodes disposed respectively between the second electrode pads and the second connection parts and providing electric connections between the two;
 the plural first connection parts and the plural second connection parts being disposed at a deeper position than one main surface of the wiring board in a depth direction from said one main surface of the wiring board, and
 the plural second salient electrodes being of a multi-stage bump structure having a larger number of stages than the plural first salient electrodes.

2. An electronic device according to claim 1, wherein the wiring board has an insulating film providing said one main surface of said wiring board, a first opening formed in the insulating film in a first area of said one main surface of said wiring board, and a second opening formed in the insulating film in a second area of said one main surface of said wiring board, the plural first connection parts are disposed in a bottom of the first opening, and the plural second connection parts are disposed in a bottom of the second opening.

3. An electronic device according to claim 1, wherein the second salient electrodes are each of a multi-stage bump structure having a base bump connected to a corresponding one of the second electrode pads of the second semiconductor chip and a stack bump stacked on the base bump.

4. An electronic device according to claim 1, wherein the second salient electrodes are each of a multi-stage bump structure having a base bump connected to a corresponding one of the second electrode pads of the second semiconductor chip, a first stack bump stacked on the base bump, and a second stack bump stacked on the first stack bump.

5. An electronic device according to claim 1, wherein the first and second salient electrodes are stud bumps.

6. An electronic device according to claim 1, wherein the wiring board has a multi-layer interconnection structure, and the plural first and second connection parts thereof are respectively portions of plural lines formed on a top wiring layer of the wiring board.

7. An electronic device according to claim 1, wherein the first and second semiconductor chips are bonded to the wiring board through a bonding resin.

8. An electronic device according to claim 7, wherein the bonding resin is an anisotropic conductive resin comprising an insulating resin with a large number of conductive particles mixed therein.

9. An electronic device comprising:
 a first semiconductor chip having a first electrode pad on one main surface thereof;
 a second semiconductor chip having a second electrode pad on one main surface thereof, the second electrode pad having a plane area smaller than that of the first electrode pad;
 a wiring board having: an insulating film; a first opening formed in the insulating film in a first area; a second opening formed in the insulating film in a second area different from the first area; a first connection part disposed in a bottom of the first opening; and a second connection part disposed in a bottom of the second opening;
 a first salient electrode disposed between the first electrode pad and the first connection part to provide an electrical connection between the two; and
 a second salient electrode disposed between the second electrode pad and the second connection part to provide an electrical connection between the two,
 wherein the second salient electrode has a multi-stage bump structure larger in the number of stages than the first salient electrode.

10. An electronic device comprising:
 a semiconductor chip;
 a plurality of salient electrodes arranged on one main surface of the semiconductor chip;
 a wiring board;
 an opening formed in one main surface of the wiring board; and
 a plurality of connection parts formed in a bottom of the opening and connected to the plural salient electrodes respectively,
 the plural salient electrodes being disposed along a first center line on said one main surface of the semiconductor chip.

* * * * *